(12) United States Patent
Yoshihisa et al.

(10) Patent No.: US 8,704,330 B2
(45) Date of Patent: Apr. 22, 2014

(54) SEMICONDUCTOR DEVICE

(75) Inventors: Yasuki Yoshihisa, Kanagawa (JP); Tetsuya Nitta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 32 days.

(21) Appl. No.: 13/305,418

(22) Filed: Nov. 28, 2011

(65) Prior Publication Data

US 2012/0139087 A1 Jun. 7, 2012

(30) Foreign Application Priority Data

Dec. 7, 2010 (JP) .................... 2010-272591

(51) Int. Cl.
*H01L 27/06* (2006.01)
*H01L 27/088* (2006.01)

(52) U.S. Cl.
USPC .......................................... 257/504; 257/547

(58) Field of Classification Search
None
See application file for complete search history.

(56) References Cited

U.S. PATENT DOCUMENTS

| 5,545,917 | A  | * | 8/1996 | Peppiette et al. | 257/547 |
| 7,880,262 | B2 | * | 2/2011 | Yamamoto | 257/501 |
| 8,344,458 | B2 | * | 1/2013 | Yoshihisa et al. | 257/355 |
| 2009/0189247 | A1 | * | 7/2009 | Yamamoto | 257/510 |

FOREIGN PATENT DOCUMENTS

JP    2009-177087    8/2009

* cited by examiner

*Primary Examiner* — Thomas L Dickey
*Assistant Examiner* — Joseph Schoenholtz
(74) *Attorney, Agent, or Firm* — McDermott Will & Emery LLP

(57) ABSTRACT

The semiconductor device includes: a semiconductor substrate; a pair of injection elements; an active barrier structure; and a p-type ground region. The semiconductor substrate has a main surface and a p-type region formed therein. The active barrier structure is arranged in a region sandwiched between the pair of injection elements over the main surface. The p-type ground region is a ground potential-applicable region which is formed closer to an end side of the main surface than the pair of injection elements and the active barrier structure, bypassing a region sandwiched between the pair of injection elements over the main surface, and which is electrically coupled to the p-type region. The p-type ground region is divided by a region adjacent to the region sandwiched between the pair of injection elements.

16 Claims, 23 Drawing Sheets

SEMICONDUCTOR DEVICE

CROSS-REFERENCE TO RELATED APPLICATIONS

The disclosure of Japanese Patent Application No. 2010-272591 filed on Dec. 7, 2010 including the specification, drawings and abstract is incorporated herein by reference in its entirety.

BACKGROUND OF THE INVENTION

The present invention relates to a semiconductor device, and more particularly to a semiconductor device having an active barrier structure.

In products used for automobiles, motor drive, audio amplifiers, and the like, an L (self inductance) load in wiring etc. sometimes produces counter-electromotive force to cause the drain (n-type region) of an output transistor to have a negative potential. In this case, the negative potential allows electrons to be injected from the drain to a p-type substrate and move from an output transistor formation region to an other element formation region through the p-type substrate, causing the other elements to malfunction.

In order to prevent the electrons injected into the p-type substrate from affecting the peripheral elements, for example, a semiconductor device disclosed in Japanese Patent Laid-open No. 2009-177087 (Patent Document 1) can be considered. In the semiconductor device disclosed in Japanese Patent Laid-open No. 2009-177087, a high-concentration impurity diffusion region is so provided as to surround a CMOS (Complementary Metal Oxide Semiconductor) circuit to be protected. Furthermore, a ground voltage is applied to the high-concentration impurity diffusion region.

Patent Document 1

Japanese Patent Laid-open No. 2009-177087

SUMMARY OF THE INVENTION

However, even in the semiconductor device disclosed in Japanese Patent Laid-open No. 2009-177087, as the semiconductor device is processed according to finer design rules, electrons may not be prevented from being injected from peripheral circuits of the circuit to be protected.

Therefore, another solution to the problem might be an active barrier region being formed between the output transistor formation region and the other element formation region. This active barrier region is formed such that a p-type region and an n-type region having a floating potential are ohmic-connected through a conductive layer.

More specifically, electrons injected into a p-type substrate disappear in the p-type substrate due to recombination or are taken into the n-type region of the active barrier region. Since electrons are taken into the n-type region of the active barrier region, the n-type region attains a positive potential. When the n-type region attains a positive potential, the p-type region of the active barrier region attains a negative potential in order to cancel this, because the p-type region and the n-type region having a floating potential are ohmic-connected through the conductive layer in the active barrier region. When the p-type region of the active barrier region attains a negative potential, the electrons injected into the p-type substrate hardly move forward from the p-type region having a negative potential. Therefore, electrons hardly reach the other element formation region from the active barrier region, preventing a malfunction of the other elements.

However, when the distance between the output transistor formation region and the other element formation region becomes smaller, even if there is provided an active barrier region, it becomes easier for the electrons injected into the p-type substrate to reach the other element formation region, causing the other element to malfunction.

The present invention is made in view of the above, and its object is to provide a semiconductor device which is highly effective in preventing movement of electrons from an output transistor formation region to an other element formation region and which can suppress the malfunction of the element.

A semiconductor device according to an embodiment of the present invention includes: a semiconductor substrate; a pair of injecting elements; an active barrier structure; and a p-type ground region. The semiconductor substrate has a main surface and a p-type region formed therein. The pair of injection elements are formed in the p-type region over the main surface. The active barrier structure is arranged over the main surface and in a region sandwiched between the pair of injection elements. The p-type ground region is a ground potential-applicable region which is formed closer to an end side of the main surface than the pair of injection elements and the active barrier structure, bypassing the region sandwiched between the pair of injection elements over the main surface, and which is electrically coupled to the p-type region. The p-type ground region is divided by a region adjacent to the region sandwiched between the pair of injecting elements.

A semiconductor device according to another embodiment of the present invention includes: a semiconductor substrate; a pair of injection elements; an active barrier structure; a p-type ground region; and an n-type region. The semiconductor substrate has a main surface and a p-type region formed therein. The pair of injection elements are formed in the p-type region over the main surface. The active barrier structure is arranged over the main surface and in a region sandwiched between the pair of injection elements. The p-type ground region is a ground potential-applicable region which is formed closer to an end side of the main surface than the pair of injection elements and the active barrier structure, bypassing the region sandwiched between the pair of injection elements over the main surface, and which is electrically coupled to the p-type region. The n-type region is arranged over the main surface between each of the pair of injection elements and the p-type ground region.

A semiconductor device according to still another embodiment of the present invention includes: a semiconductor substrate; a pair of injection elements; an active barrier structure; an n-type ground region; and a p-type ground region. The semiconductor substrate has a main surface and a p-type region formed therein. The pair of injection elements are formed in the p-type region over the main surface. The active barrier structure is arranged over the main surface and in a region sandwiched between the pair of injection elements. The n-type ground region is arranged over the main surface in a region sandwiched between the pair of injection elements and is a region to which a ground potential can be applied. The p-type ground region is a ground potential-applicable region which is formed closer to an end side of the main surface than the pair of injection elements, the active barrier structure, and the n-type ground region, bypassing the region sandwiched between the pair of injection elements, and which is electrically coupled to the p-type region.

According to the semiconductor device of one embodiment of the present invention, the electrons emitted from one of the pair of injection elements and injected into the inside (p-type region) of the semiconductor substrate are attracted toward the p-type ground region. The p-type ground region is divided by a region adjacent to the region sandwiched between the pair of injection elements. Therefore, the electrons are prevented from detouring from one of the pair of injection elements to reach the other of the pair of injecting elements.

According to the semiconductor device of another embodiment of the present invention, the electrons emitted from one of the pair of injection elements and injected into the inside (p-type region) of the semiconductor substrate are attracted toward the p-type ground region. In this regard, an n-type region is arranged between the p-type ground region and each of the pair of injection elements. The n-type region serves as a resistor. For this reason, it becomes difficult for the electrons coming out from one of the pair of injection elements and reaching the n-type region to enter the other of the pair of injection elements from the n-type region. As a result, the electrons coming from one of the injection elements and reaching the n-type region are prevented from detouring and reaching the other injection element.

In a semiconductor device according to still another embodiment of the present invention, electrons emitted from one of the pair of injection elements and injected into the inside (p-type region) of the semiconductor substrate reaches the n-type ground region on the way to the other injection element. The electrons having reached the n-type ground region are drawn out from the semiconductor substrate by the ground potential applied to the n-type ground region. Therefore, it becomes difficult for the above electrons to reach the other injection element. For this reason, the electrons coming from one of the injection elements and reaching the n-type region are prevented from entering the other injection element.

DESCRIPTION OF THE PREFERRED EMBODIMENTS

With reference to the drawings, embodiments of the present invention will be described below.

First Embodiment

Now, with reference to FIG. 1, arrangement of each element formation region over a main surface of a semiconductor substrate SUB will be described.

Figure 1:
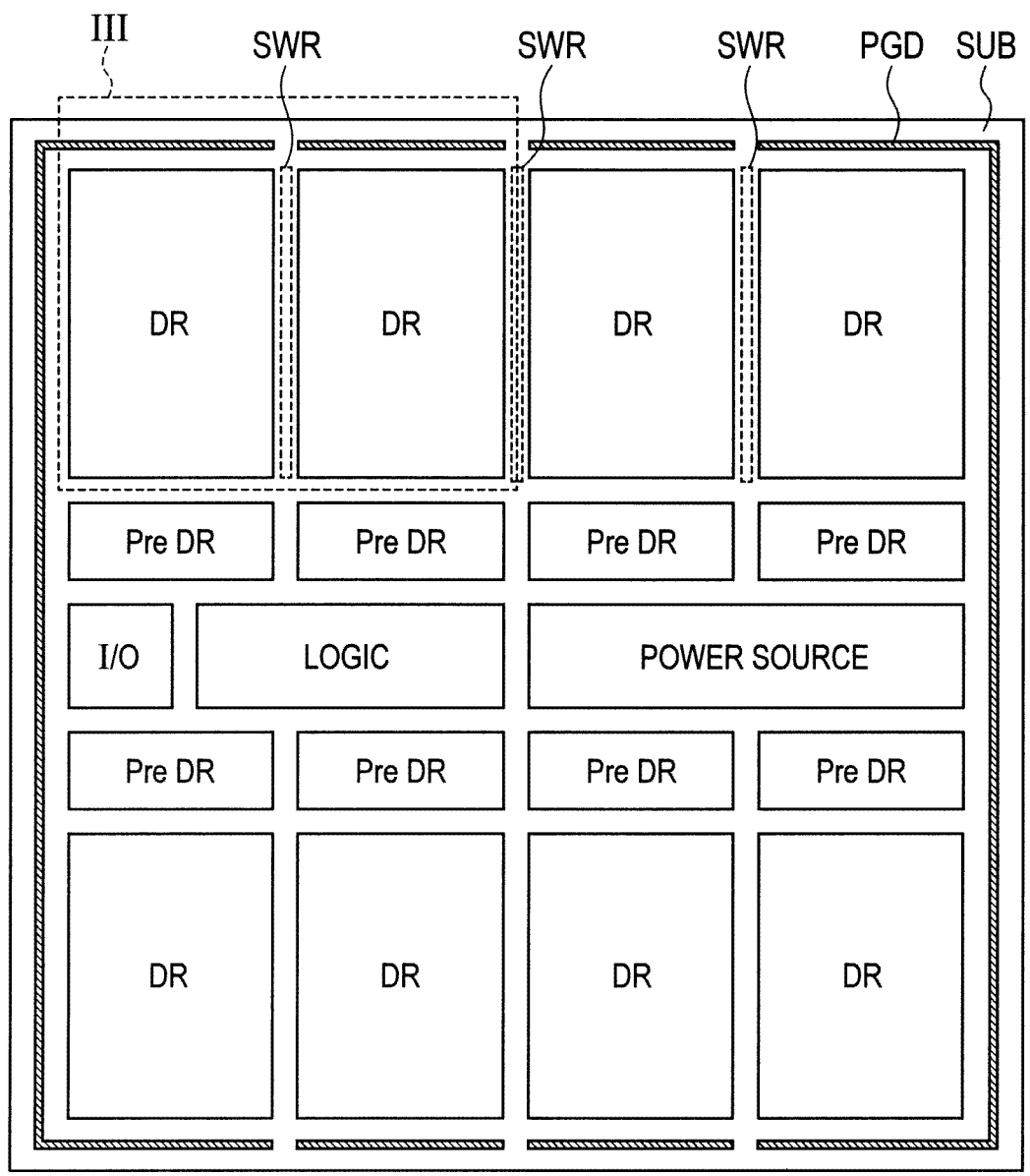
FIG. 1 is a schematic plan view showing a semiconductor device in a first embodiment of the present invention.

Referring to FIG. 1, a semiconductor device of the present embodiment includes, over the main surface of the semiconductor substrate SUB, for example, a power source circuit formation region, a logic circuit formation region, an input-output circuit I/O formation region, a pre-driver PreDR formation region, an injection element (driver) DR formation region, and a p-type ground region PGD. Over the main surface of the semiconductor substrate SUB, these formation regions are isolated from each other, for example, by an element isolation structure including a trench isolation structure.

The power source circuit supplies a power source voltage for starting the logic circuit and the input-output circuit I/O. The logic circuit has control circuits, such as a logic circuit and, for example, includes two or more MIS (Metal Insulator Semiconductor) transistors etc. The input-output circuit I/O is a circuit which performs input and output operations of electric signals between the logic circuit and the injection element DR. The pre-driver PreDR is a region in which there is formed a circuit to raise the power source voltage to be supplied to the logic circuit by the power source circuit. The power source voltage supplied by the power source circuit to the logic circuit is lower than a voltage value necessary for driving the injection element DR. For this reason, the pre-driver PreDR arranged between the power source circuit or the logic circuit and the injection element DR raises the power source voltage to a level of a voltage value with which the injection element DR can be operated.

The injection element DR formation regions are arranged on both sides of the main surface of the semiconductor substrate SUB so as to sandwich the power source circuit formation region, the logic circuit formation region, the input-output circuit I/O formation region, and the pre-driver PreDR formation region. The p-type ground region PGD is a p-type region to which a ground potential is applied. Further, the p-type ground region PGD is arranged over the main surface of the semiconductor substrate closer to the outer circumference (the end side of the main surface) than the formation regions of the power source circuit, the logic circuit, the input-output circuit I/O, the pre-driver PreDR and the injection element (driver) DR, and so formed as to surround these regions. The formation region of the injection element DR is a region where an output element is formed. Next, with reference to FIG. 2, a specific configuration of the injection element DR will be described.

Figure 2:
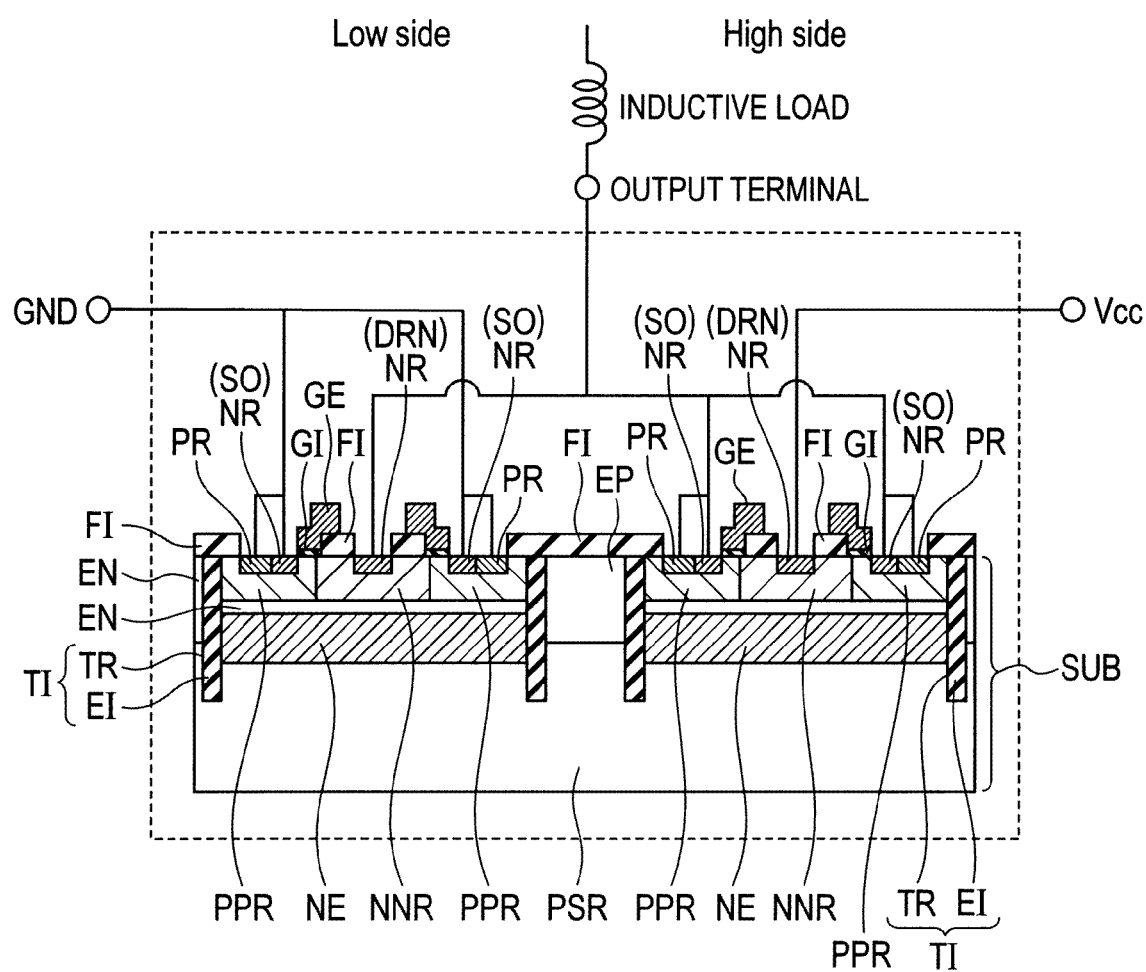
FIG. 2 is a schematic cross-sectional view showing a more detailed configuration of an injection element of FIG. 1.

Referring to FIG. 2, the output element of the injection element DR includes: a buried n-type diffusion region NE; an n-type epitaxial layer EN; a high-voltage Low side MIS transistor; and a high-voltage High side MIS transistor.

A p-type impurity region PSR (p-type region) is formed in the semiconductor substrate SUB. So as to form a pn junction with the p-type impurity region PSR, there is formed an n-type region including: a buried n-type diffusion region NE; an epitaxial layer EN; an $n^-$ diffusion region NNR; and an n-type diffusion region NR.

Over the epitaxial layer EN, a $p^-$ diffusion region PPR is so formed as to adjoin the $n^-$ diffusion region NNR. Over the main surface of the semiconductor substrate SUB in the $p^-$ diffusion region PPR, the n-type diffusion region NR and a p-type diffusion region PR are formed next to each other.

Each of the Low side and High side MIS transistors mainly includes: the n-type diffusion region NR (coupled to a ground terminal GND) as a source region SO; the n-type diffusion region NR (coupled to High side) as a drain region DRN; a gate insulating film GI; and a gate electrode GE. The source region SO is formed inside the $p^-$ diffusion region PPR, and the drain region DRN is formed inside the $n^-$ diffusion region NNR. Moreover, the source region SO is so formed as to adjoin the p-type diffusion region PR. The gate electrode GE is formed over the main surface of the semiconductor substrate SUB sandwiched between the source region SO and the drain region DRN with the gate insulating layer GI interposed therebetween.

An interlayer insulating layer FI is formed over the main surface of the semiconductor substrate SUB. Inside the semiconductor substrate SUB, the circumference of the MIS transistor is surrounded by a trench isolation structure TI. The trench isolation structure TI has: a trench TR formed in the main surface of the semiconductor substrate SUB; and a buried insulating layer EI such as a silicon oxide film buried inside the trench TR. The trench isolation structure TI electrically isolates the Low side MIS transistor formation region from the High side MIS transistor formation region.

A Vcc potential can be applied to the drain region NR of the High side MIS transistor, and a GND potential can be applied to the source region NR of the Low side MIS transistor. The source region NR of the High side MIS transistor and the drain region NR of the Low side MIS transistor are electrically coupled to an output terminal (for example, a bonding pad of a semiconductor chip). The output terminal may be electrically coupled to an inductive load of the external device.

Next, with reference to FIG. 1 and FIGS. 3 to 5, a configuration of a periphery of the injection element DR and the p-type ground region PGD will be described.

Figure 3:
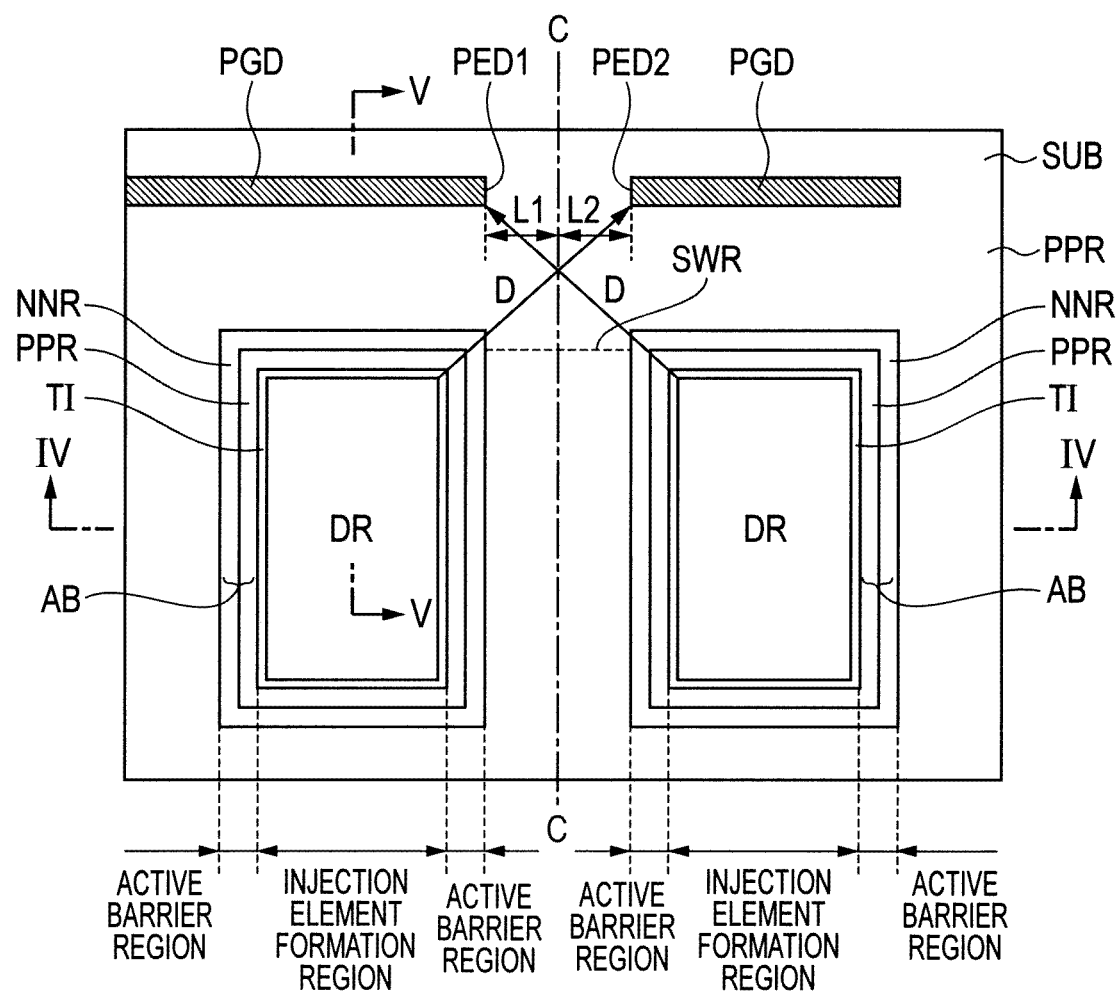
FIG. 3 is a schematic plan view showing a more detailed configuration of a region surrounded by a dotted line "III" in FIG. 1.

Referring to FIG. 3, for example, over the main surface of the semiconductor substrate SUB, the trench isolation structure TI surrounds each of the formation regions of the two or more injection elements DR having the structure of FIG. 2. Over the main surface of the semiconductor substrate SUB, an active barrier region AB further surrounds the outer circumference of the trench isolation structure TI surrounding the circumference of the injection element DR. Around the active barrier region AB, there is arranged a p-type region (a p-type diffusion region PE and a $p^-$ diffusion region PPR).

Figure 4:
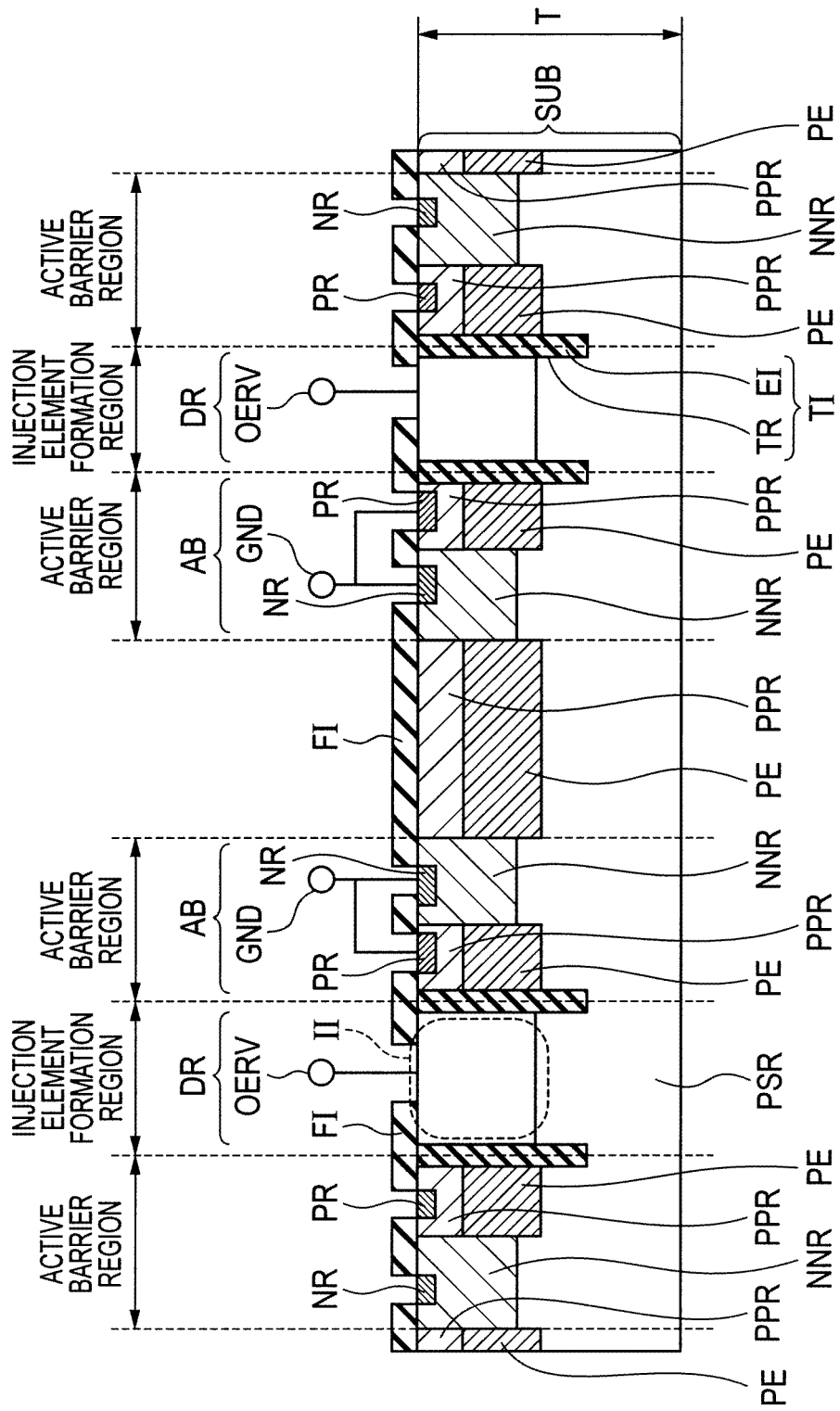
FIG. 4 is a schematic cross-sectional view taken along line IV-IV in FIG. 3.

Referring to FIGS. 3 and 4, as in the case described above, the trench isolation structure TI has: a trench TR formed in the main surface of the semiconductor substrate SUB; and a buried insulating layer EI to fill in the trench TR. The active barrier region AB includes a p-type region (p-type barrier region) and an n-type region (n-type barrier region) both formed over the main surface of the semiconductor substrate SUB. The p-type region and the n-type region forming the active barrier region AB are ohmic-connected to each other.

The p-type region of the active barrier region AB has: a buried p-type diffusion region PE; a $p^-$ diffusion region PPR; and a p-type diffusion region PR. The buried p-type diffusion region PE is formed over the p-type impurity region PSR so as to be in contact with the p-type impurity region PSR inside the semiconductor substrate SUB. The $p^-$ diffusion region PPR is formed over the buried p-type diffusion region PE, and the p-type diffusion region PR is formed over the main surface of the semiconductor substrate SUB inside the $p^-$ diffusion region PPR.

The n-type region of the active barrier region AB has: an $n^-$ diffusion region NNR; and an n-type diffusion region NR. The $n^-$ diffusion region NNR is formed over the p-type impurity region PSR so as to be in contact with the p-type impurity region PSR inside the semiconductor substrate SUB and to form a pn junction. The n-type diffusion region NR is formed over the main surface of the semiconductor substrate SUB inside the n-type diffusion region NNR.

According to the present embodiment, the p-type region PE, PPR, and PR of the active barrier region are arranged on the inner circumference side than the n-type regions NNR and NR, that is, closer to respective injection element formation regions DR.

Figure 5:
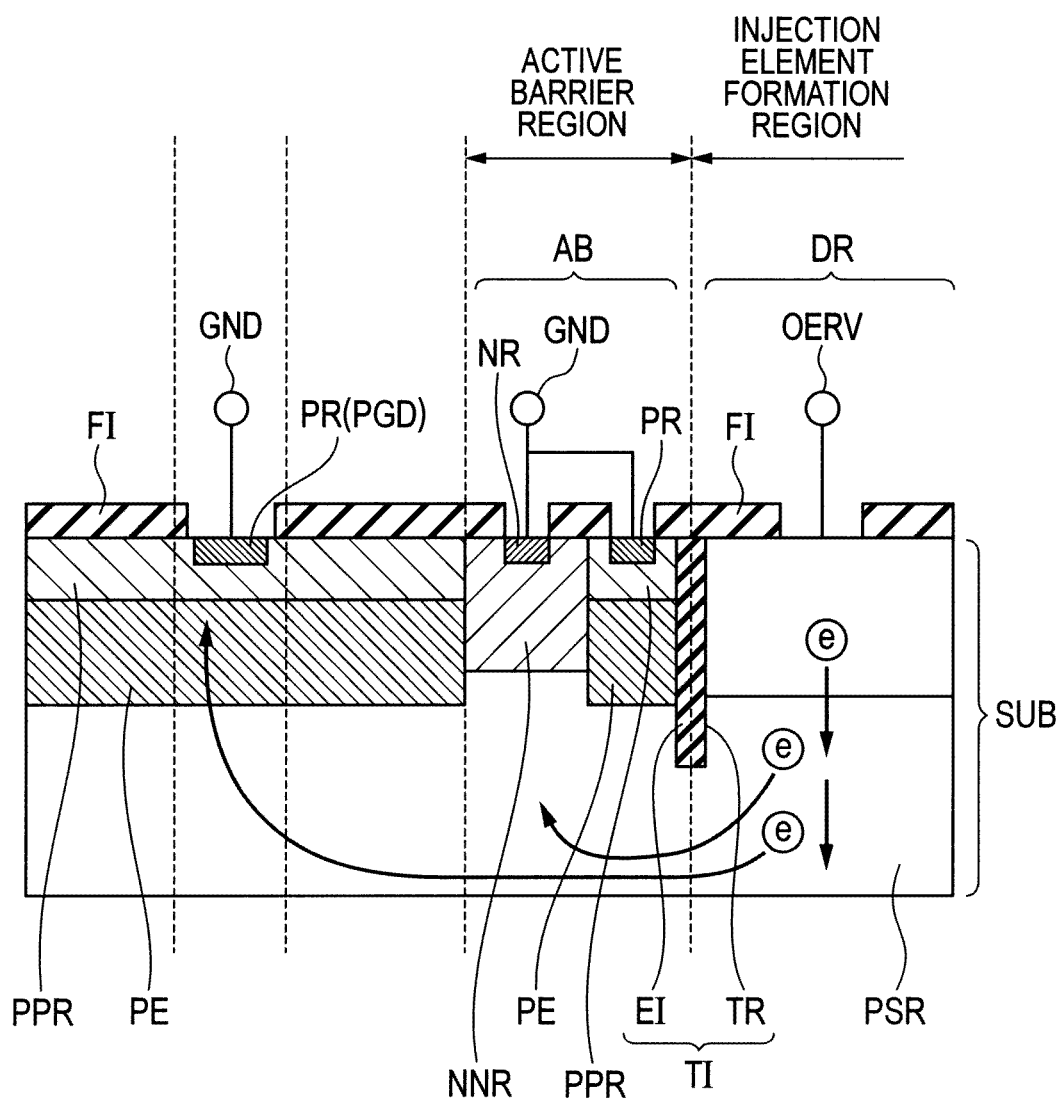
FIG. 5 is a schematic cross-sectional view taken along line V-V in FIG. 3.

Referring to FIG. 5, a p-type ground region PGD includes a p-type diffusion region PR formed over the main surface of the semiconductor substrate SUB inside the $p^-$ diffusion region PPR. The $p^-$ diffusion region PPR is formed, through the buried p-type diffusion region PE, over the p-type impurity region PSR inside the semiconductor substrate SUB.

The p-type ground region PGD is electrically coupled to the p-type impurity region PSR formed in the semiconductor substrate SUB. That is, the p-type ground region PGD is electrically coupled, through the $p^-$ diffusion region PPR and the buried p-type diffusion region PE, to the p-type impurity region PSR. A ground potential can be applied to the p-type ground region PGD.

Referring to FIGS. 1 and 3, the p-type grounding region PGD is formed over the main surface of the semiconductor substrate SUB closer to the end side (perimeter side) than the formation regions of the injection element DR, the active barrier region AB, the power source circuit, the logic circuit, etc. The p-type ground region PGD is formed over the main surface of the semiconductor substrate SUB along the outline of the semiconductor substrate SUB in a frame-like manner.

The p-type ground region PGD is so formed over the main surface of the semiconductor substrate SUB as to bypass a region SWR sandwiched between the formation regions of the pair of adjacent injection elements DR. That is, the p-type ground region PGD is not formed in the region SWR sandwiched between the formation regions of the pair of adjacent injection elements DR.

Moreover, the p-type ground region PGD is divided by a region adjacent to the region SWR sandwiched between the formation regions of the pair of adjacent injection elements DR over the main surface of the semiconductor substrate SUB. In this regard, the region adjacent to the region SWR is the one located in a direction perpendicular to a direction in which the formation regions of the pair of adjacent injection elements DR face with each other as seen from the position of the region SWR over the main surface of the semiconductor substrate SUB. Moreover, the isolation of the p-type ground region PGD means that the p-type diffusion regions PR forming the p-type ground region PCD are not joined continuously and that there exist a region other than the p-type diffusion region PR (for example, the p$^-$ diffusion region) between the p-type diffusion regions PR forming the p-type ground region PGD.

Moreover, as shown in FIG. 1, when formation regions of three or more (for example, four) injection elements DR are arranged in a row, there exist two or more (for example, three) regions SWR sandwiched between the formation regions of the pair of injection elements DR. In such a case, the p-type ground region PGD is divided by the adjacent regions of the two or more regions SWR. As a result, over the main surface of the semiconductor substrate SUB, the p-type ground region PGD is formed in a non-continuous frame-like manner such that it is partially divided along the outline of the semiconductor substrate SUB.

Thus, the p-type ground region PGD extends in the region (above the injection element DR in FIG. 3) adjacent to the formation region of the injection element DR. At the same time, it is divided by the region (above the region SWR in FIG. 3) adjacent to the region SWR sandwiched between the formation regions of the pair of injection elements DR. In addition, whole of the p-type ground region PGD adjacent to the region SWR may be divided and broken off. Alternatively, part of the region adjacent to the region SWR may be divided and broken off.

Over the main surface of the semiconductor substrate SUB, the isolated p-type ground region PGD is so arranged as to be in line symmetry with respect to a center line (imaginary one-point chain line C-C) between the formation regions of the pair of injection elements DR. In this regard, the isolated p-type ground region PGD being in line symmetry means that a distance L1 between the center line C-C and an end part PED1 of the left-hand side in FIG. 3 of the center line C-C of the divided p-type ground region PGD is substantially equal to a distance L2 between the center line C-C and the end part PED2 of the right-hand side in FIG. 3 of the center line C-C.

By being divided, as described above, the p-type ground region PGD comes to have the end part PED1 of the left-hand side in FIG. 3 and the end part PED2 of the right-hand side in FIG. 3. Each of the shortest distance D between the end part PED1 of the left-hand side in FIG. 3 and the injection element DR of the right-hand side in FIG. 3 and the shortest distance D between the end part PED2 of the right-hand side in FIG. 3 and the injection element DR of the left-hand side in FIG. 3 is greater than a thickness T of the semiconductor substrate SUB shown in FIG. 4. In this regard, the thickness T of the semiconductor substrate SUB is a length from the main surface of the semiconductor substrate SUB over which an element isolation structure is not formed to a back surface thereof.

In a plan view of FIG. 3, the impurity regions NR and PR of FIG. 4 forming the active barrier region AB are not shown.

In FIGS. 4 and 5, for the sake of simplicity, a specific configuration of the injection element is omitted. The specific configuration is shown in FIG. 2. Moreover, according to the present embodiment, the injection element formation region DR is surrounded by the trench isolation structure TI inside the semiconductor substrate SUB. However, these regions may be surrounded by element isolation structures (for example, a LOCOS (Local Oxidation of Silicon)) other than the trench isolation structure TI. Moreover, the element isolation structure surrounding the injection element formation region DR may be formed by what is called a pn junction joining, for example, a p-type region and an n-type region.

Next, with reference to comparative examples, the operation and effect of the semiconductor device of the present embodiment will be described. During the operation, electrons may be injected into the semiconductor substrate SUB from an output element included in the injection element DR. First, this process will be explained.

Referring to FIG. 2, when the High side MIS transistor is in the ON state and the Low side MIS transistor is in the OFF state, a current flows into inductance load from the High side MIS transistor. In this state, when the Low side MIS transistor is switched to the ON state with the High side MIS transistor in the OFF state, the inductive load tends to keep current flowing. Since an electromotive force occurs accordingly, a negative potential is applied to the drain region NR of the Low side MIS transistor. For this reason, a forward bias is applied to a pn junction of n-type regions NR, NNR, EP, and NE of the Low side MIS transistor formation region and the p-type region PSR. Then, electrons are injected into the p-type region of the semiconductor substrate SUB from the n-type regions NR, NNR, EP, and NE of the injection element formation region.

Figure 6:
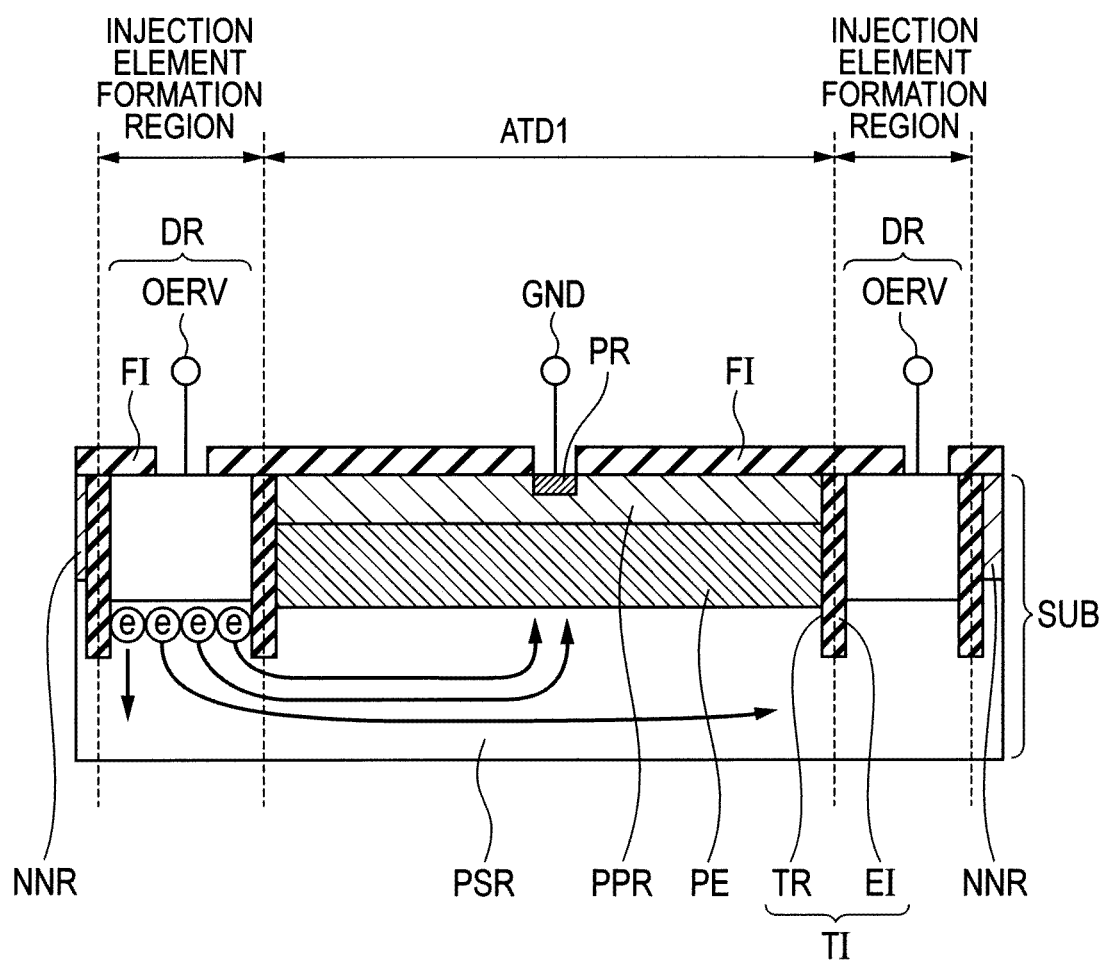
FIG. 6 is a schematic cross-sectional view showing movement of electrons inside a semiconductor device as a first comparative example.

In this way, when electrons are injected into the semiconductor substrate SUB from the injection element DR, the electrons are less likely to undergo recombination in the low-concentration p-type impurity region PSR. Therefore, when the injected electrons reach the other injection element DR, the other injection element DR may have a malfunction. In order to prevent such a malfunction, as shown in FIG. 6, it can be considered to provide a p-type region having a ground potential GND between the formation regions of the pair of injection elements DR. The p-type region has: a buried p-type diffusion region PE; a p$^-$ diffusion region PPR; and a p-type diffusion region PR, which are sequentially formed over the p-type impurity region PSR in the semiconductor substrate SUB. In addition, a trench isolation structure TI is formed between the injection element DR formation region and the p-type regions PE, PPR, and PR having ground potentials.

According to the configuration of FIG. 6, the electrons moving from one injection element DR to the other injection element DR are absorbed through a ground terminal coupled to the p-type diffusion region PR. As a result, the movement of the electrons through diffusion from one injection element DR to the other injection element DR can be suppressed.

Figure 7:
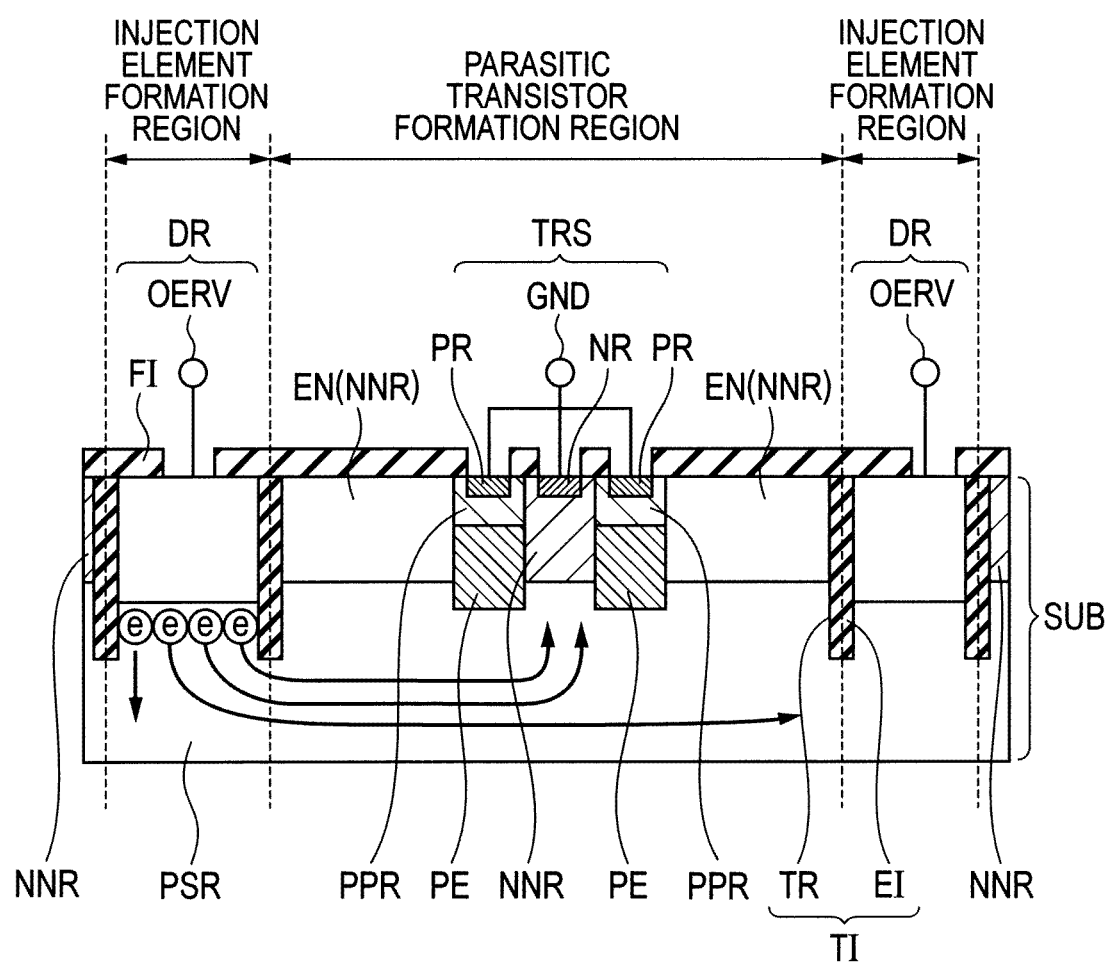
FIG. 7 is a schematic cross-sectional view showing movement of electrons inside a semiconductor device as a second comparative example.

Moreover, as shown in FIG. 7, the same effect as in FIG. 6 can be obtained when, in place of the p-type region having the ground potential of FIG. 6, providing a parasitic npn transistor TRS between the formation regions of the pair of injection elements DR. The parasitic npn transistor TRS is configured such that the p-type region having a buried p-type diffusion region PE, a p⁻ diffusion region PPR, and a p-type diffusion region PR is sandwiched between a pair of n-type regions having an n⁻ diffusion region NNR and an n-type diffusion region NR.

Referring to FIG. 6 again, since the concentration of the p-type impurities in the p-type impurity region PSR is low, inside the p-type impurity region PSR, the electrons having entered are less likely to undergo recombination with a hole. Therefore, the electrons diffused inside the p-type impurity region PSR move mainly choosing one of the following two routes. As shown in FIGS. 5 and 6, one of them is a route in which electrons inside the p-type impurity region PSR are absorbed in a lower part of the semiconductor substrate SUB. The other is, as shown in FIGS. 5 and 6, a route in which the electrons are attracted toward the ground terminal by the ground voltage applied to the p-type diffusion region PR. The reason for choosing the latter route is that since a voltage OERV applied to the n-type region of the output element formation region attains a negative potential, the ground voltage becomes higher than the negative potential. The electrons tend to move toward the higher potential side. Therefore, the electrons having entered the p-type impurity region PSR of the output element formation region move toward the region to which the ground voltage is applied.

In this regard, in particular, when the distance between one injection element DR and the other injection element DR becomes shorter, some of the electrons having entered the p-type impurity region PSR from one injection element DR and having reached the region between the injection element formation regions pass through the region between the injection element formation regions with their momentum. For this reason, it becomes easier for the electrons to reach the other injection element DR. Due to the entrance of the electrons, the other injection element DR tends to have a malfunction. Similarly, also with respect to the electrons having entered the p-type impurity region PSR from the other injection element DR and having reached the region between the injection element formation regions, some of the electrons reach one injection element DR, and the one injection element DR is likely to have a malfunction. As in the configuration of FIG. 6, a malfunction also tends to occur in the configuration of FIG. 7.

Figure 8:
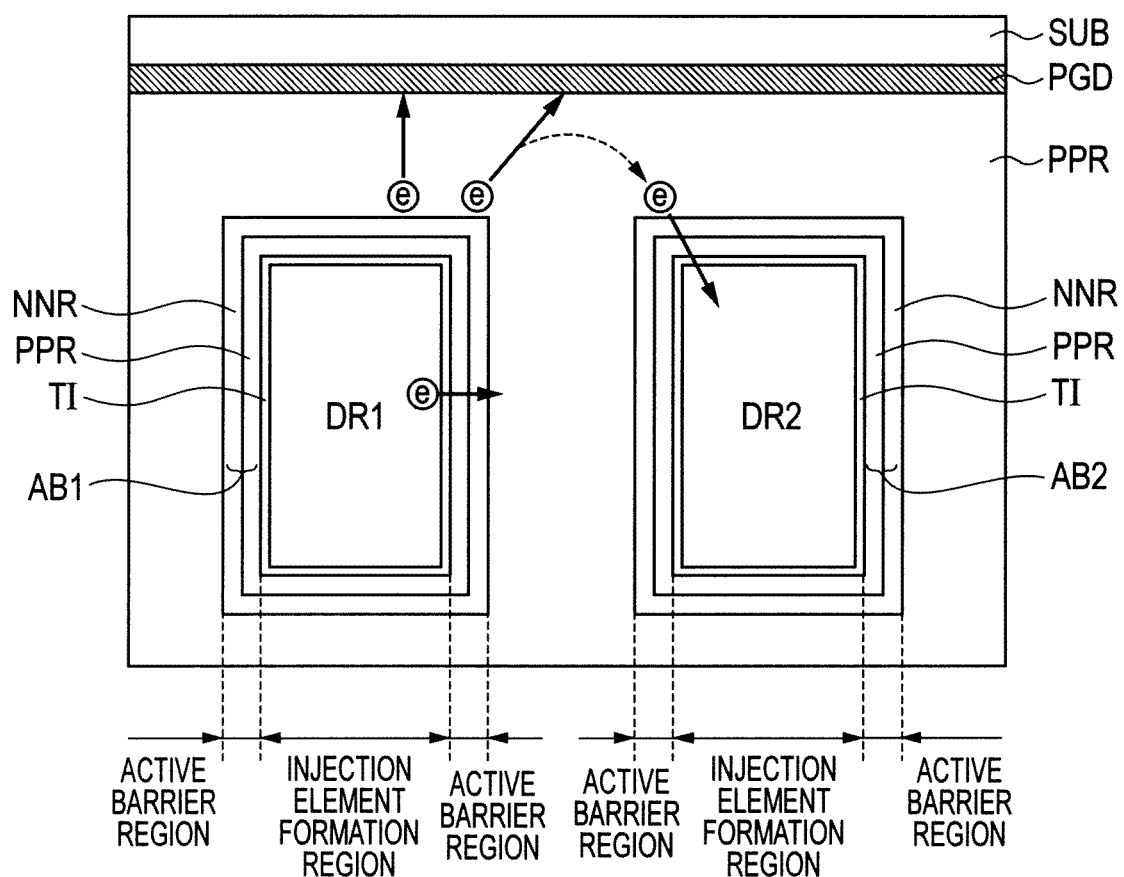
FIG. 8 is a schematic plan view showing movement of electrons from an injection element in a case where the semiconductor device of the configuration of FIGS. 6 and 7 has an active barrier region and a p-type region which attracts the electrons.

Moreover, as in the case of the pair of injection elements, when the electrons are injected into the substrate in both directions, as shown in FIG. 8, there may be arranged active barrier regions AB1 and AB2 surrounding the circumference of the pair of injection elements DR1 and DR2, respectively.

Referring to FIG. 8, when arranging the active barrier regions AB1 and AB2 so as to surround the circumference of the pair of injection elements DR1 and DR2, respectively, for example, some of the electrons entering the p-type impurity region PSR of the semiconductor substrate SUB from the injection element DR1 move toward the injection element DR2. On the way, the electrons are taken into the n-type barrier region serving as the active barrier region AB2 arranged between the injection element DR1 and the injection element DR2.

In this regard, the n-type barrier region and the p-type barrier region of the active barrier region are ohmic-connected to each other. Therefore, some of the electrons taken into the n-type barrier region are recombined with the hole supplied from the p-type barrier region being short-circuited in wiring. Then, the potential of the p-type barrier region having supplied the hole is lowered. When the potential of the p-type barrier region of the active barrier region is lowered, it becomes difficult for the electrons injected into the p-type impurity region PSR to advance to the injection element DR2 side beyond the p-type barrier region whose potential has been lowered. In addition, in the active barrier region AB1 also, because of the similar effect as above, it becomes possible to suppress the amount of electrons entering the p-type impurity region PSR of the semiconductor substrate SUB from the injection element DR1. As a result, the electrons are less likely to reach the injection element DR2 from the injection element DR1. For the same reason as above, the electrons are less likely to reach the injection element DR1 from the injection element DR2. Therefore, the active barrier regions AB1 and AB2 can prevent the occurrence of the malfunction of the MIS transistors TRS of the injection elements DR1 and DR2 caused by the electrons from the other side reaching one of the injection elements DR1 and DR2.

However, as described above, even when the active barrier region is arranged between the injection elements DR1 and DR2, if the distance between the injection elements DR1 and DR2 in particular becomes shorter, the proportion of the electrons attracted to the active barrier region reaching the other injection element side from one injection element side increases. Therefore, as shown in FIG. 8, when the p-type ground region PGD being a p-type region for attracting the electrons is arranged in the region (the end side of the main surface of the semiconductor substrate SUB) avoiding the region sandwiched between the pair of injection elements, for example, some of the electrons entering the p-type impurity region from the injection element DR1 are attracted to the p-type ground region PGD. This is because the ground voltage is applied to the p-type ground region PGD. For this reason, as compared to the case where the active barrier regions AB1 and AB2 alone are arranged, by arranging the p-type ground region PGD, it becomes possible to more reliably suppress the electrons inside the p-type impurity region PSR entering the other injection element from the one injection element.

However, as shown in FIG. 8, if the p-type ground region PGD is continuously formed also in the region adjacent to the region sandwiched between the pair of injection elements DR1 and DR2, the electrons from the injection element DR1 are also attracted by the p-type ground region of the adjacent region. Then, some of the electrons bypass (detour) in the direction shown by the arrow of a dotted line of FIG. 8, advances toward the injection element DR2, and may enter the inside of the injection element DR2.

Figure 9:
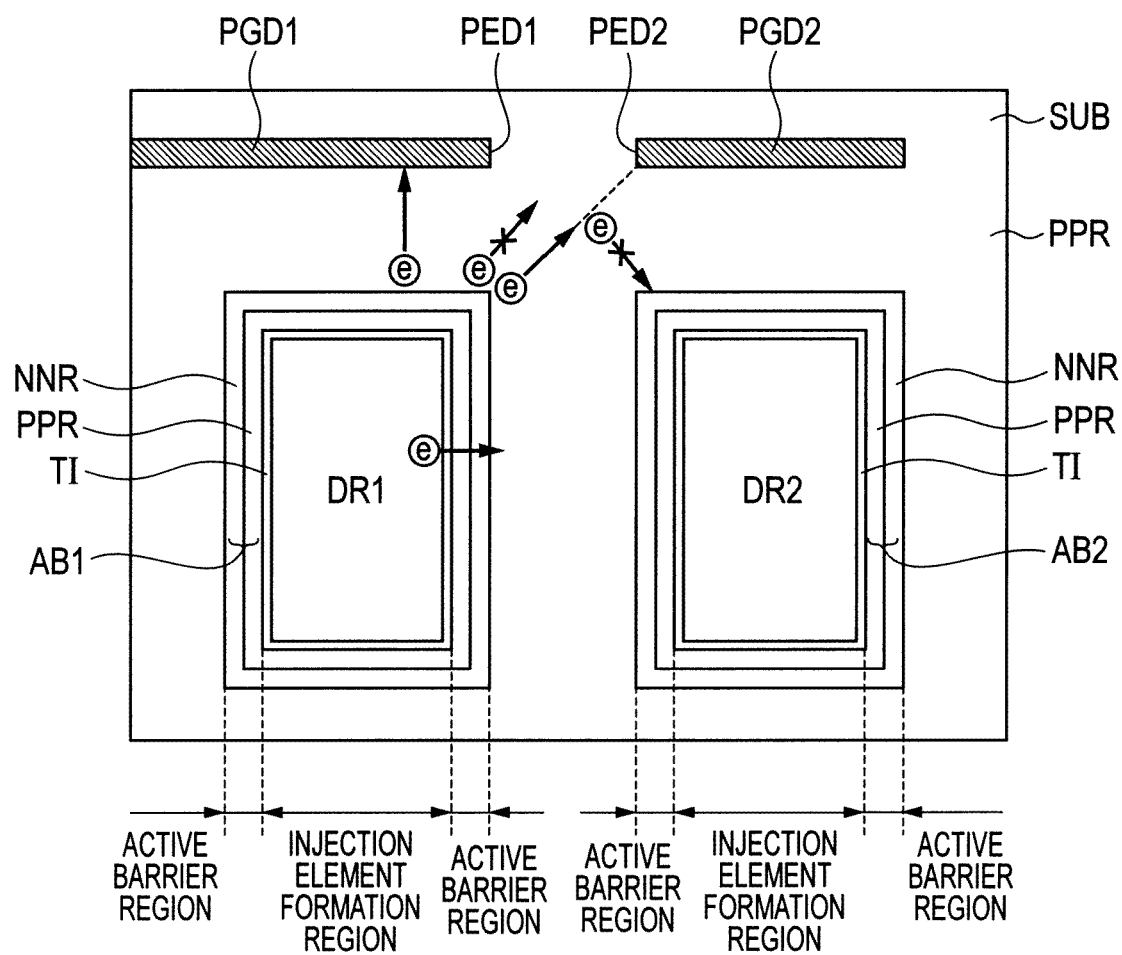
FIG. 9 is a schematic plan view showing movement of the electrons from the injection element in a case where the p-type region of FIG. 8 attracting the electrons is divided as in the first embodiment.

In this regard, according to the present embodiment, as shown in FIG. 9, the p-type ground region PGD is divided by a region adjacent to the region sandwiched between the pair of injection elements DR1 and DR2. Since the p-type ground region PGD is not arranged in the above adjacent region, the region does not attract the element from the injection element DR1. The p-type ground region PGD1 arranged in the region adjacent to the injection element DR1 attracts the electrons from the injection element DR1. However, the possibility of the electrons detouring in the direction of the injection element DR2 is low, and most of the electrons are taken into the p-type ground region PGD1. For this reason, as in the present embodiment, by employing the structure of the p-type ground region being isolated, the p-type ground regions PGD1 and PGD2 can control the direction of movement of the electrons from the injection elements DR1 and DR2 with high precision. Therefore, it becomes possible to more reliably suppress the malfunction etc. of the injection element resulting from the electrons entering the injection element.

As shown in FIG. 9, some of the electrons from one injection element DR1 (one injection element) are attracted by an end part PED2 (the other end part) of the p-type ground region PGD2 adjacent to the other injection element DR2 and may move in the upper right direction in FIG. 9. In this case, some of the electrons moving toward the end part PED2 may detour and move toward the injection element DR2. Therefore, referring to FIGS. 9 and 3, according to the present embodiment, it is preferable that the shortest distance D between one injection element DR1 (DR) and the end part PED2 is greater than the thickness T of the semiconductor substrate SUB. In this way, for example, the electrons entering the inside of the p-type impurity region PSR from the injection element DR1 of FIG. 9 preferentially move toward the lower part of the semiconductor substrate SUB rather than to the end part PED2. The reason is that, as seen from the main surface of the injection element DR1, the distance to the lower part of the semiconductor substrate SUB is shorter than the distance to the end part PED2 and it is easier for the electrons to move toward it. Therefore, it becomes possible to reduce the probability of the electrons having entered the inside of the p-type impurity region PSR from the injection element DR1 moving toward the p-type ground region PGD2, making a detour on the way, and advancing to the injection element DR2.

In addition, as in the above case, with respect to the shortest distance D to the other injection element DR2 (DR) and to the end part PED1 (one end part), it is preferably greater than the thickness T of the semiconductor substrate SUB. In this regard, for example, when the shortest distance D in FIG. 3 is greater than the thickness T of the semiconductor substrate SUB, if the pair of p-type ground regions PGD are arranged so as to be in line symmetry with respect to the center line (imaginary one-point chain line C-C), the shortest distance between the injection element DR2 and the end part PED1 is also equivalent to D. Therefore, it becomes possible to reduce the probability that some of the electrons from the injection element DR2 make a detour on the way to the end part PED1 and move toward the injection element DR1.

Second Embodiment

The present embodiment differs from the first embodiment in the configuration of the region attracting the electrons formed in the semiconductor device. Hereafter, the configuration of the present embodiment will be described.

Figure 10:
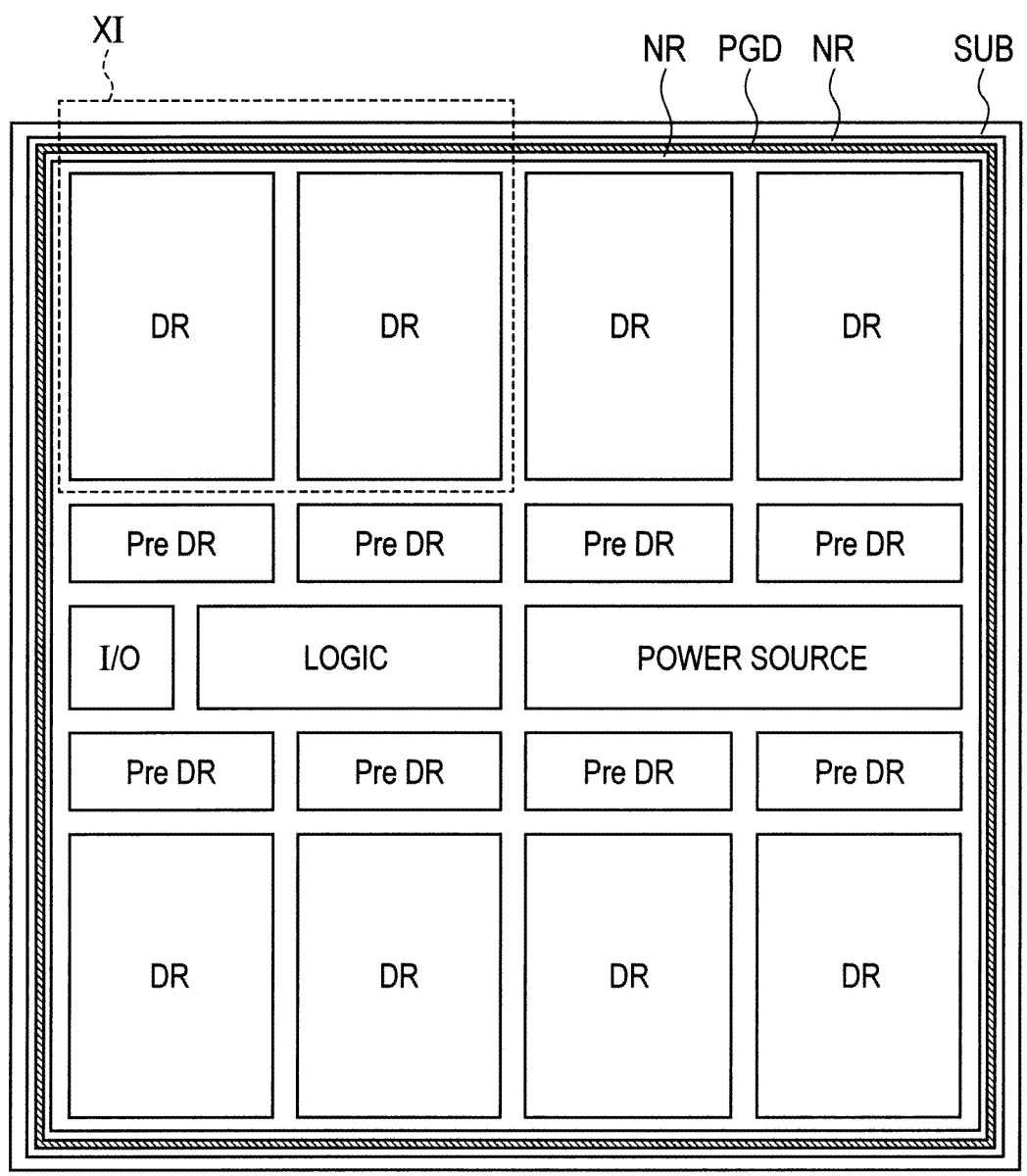
FIG. 10 is a schematic plan view showing a semiconductor device in a second embodiment of the present invention.
Figure 11:
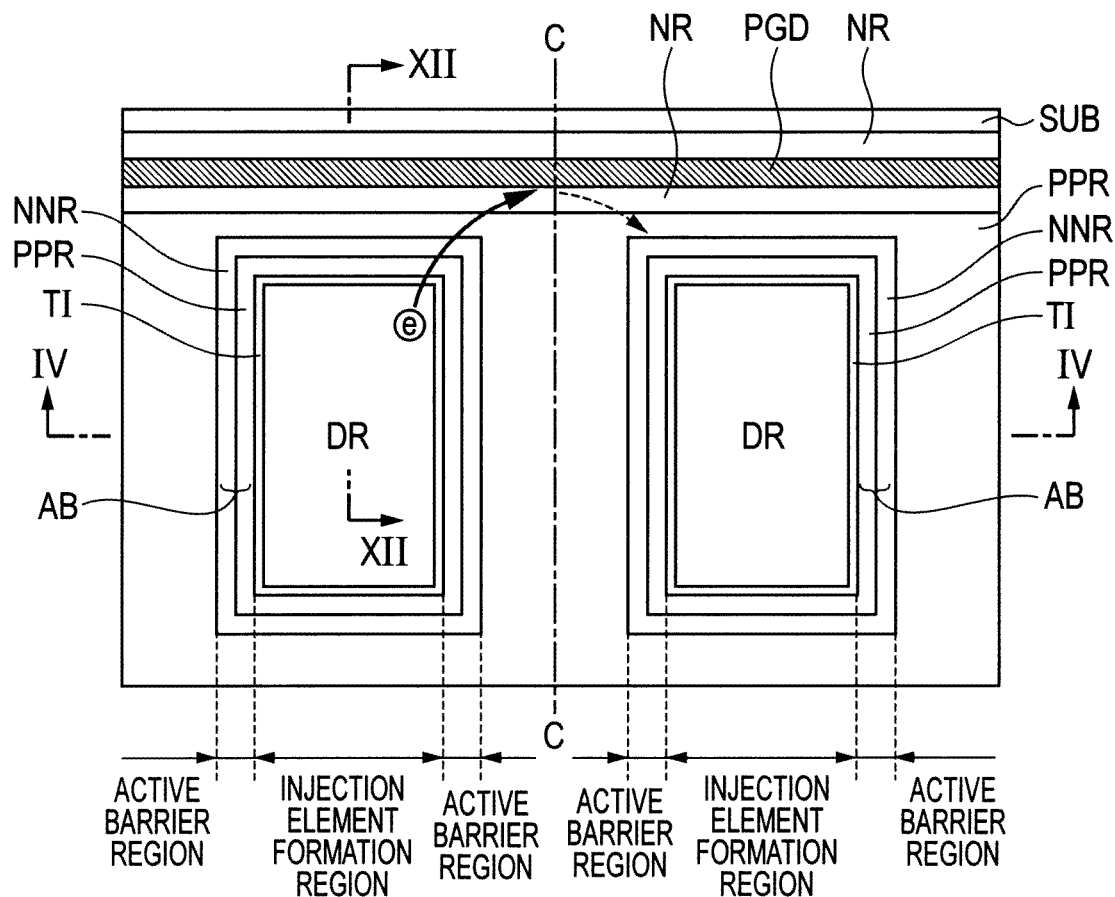
FIG. 11 is a schematic plan view showing a more detailed configuration of a region surrounded by a dotted line "XI" in FIG. 10.

Referring to FIGS. 10 and 11, in a semiconductor device according to the present embodiment, an n-type region NR is so arranged as to surround the outer circumference of a p-type ground region PGD. The n-type region NR has a floating potential (stray potential). In addition, the p-type ground region PGD of FIGS. 10 and 11 is not divided even by a region adjacent to the region sandwiched between the formation regions of the pair of injection elements DR adjacent to each other over the main surface of the semiconductor substrate SUB, and extends continuously along the direction in which two or more injection elements DR are arranged.

Figure 12:
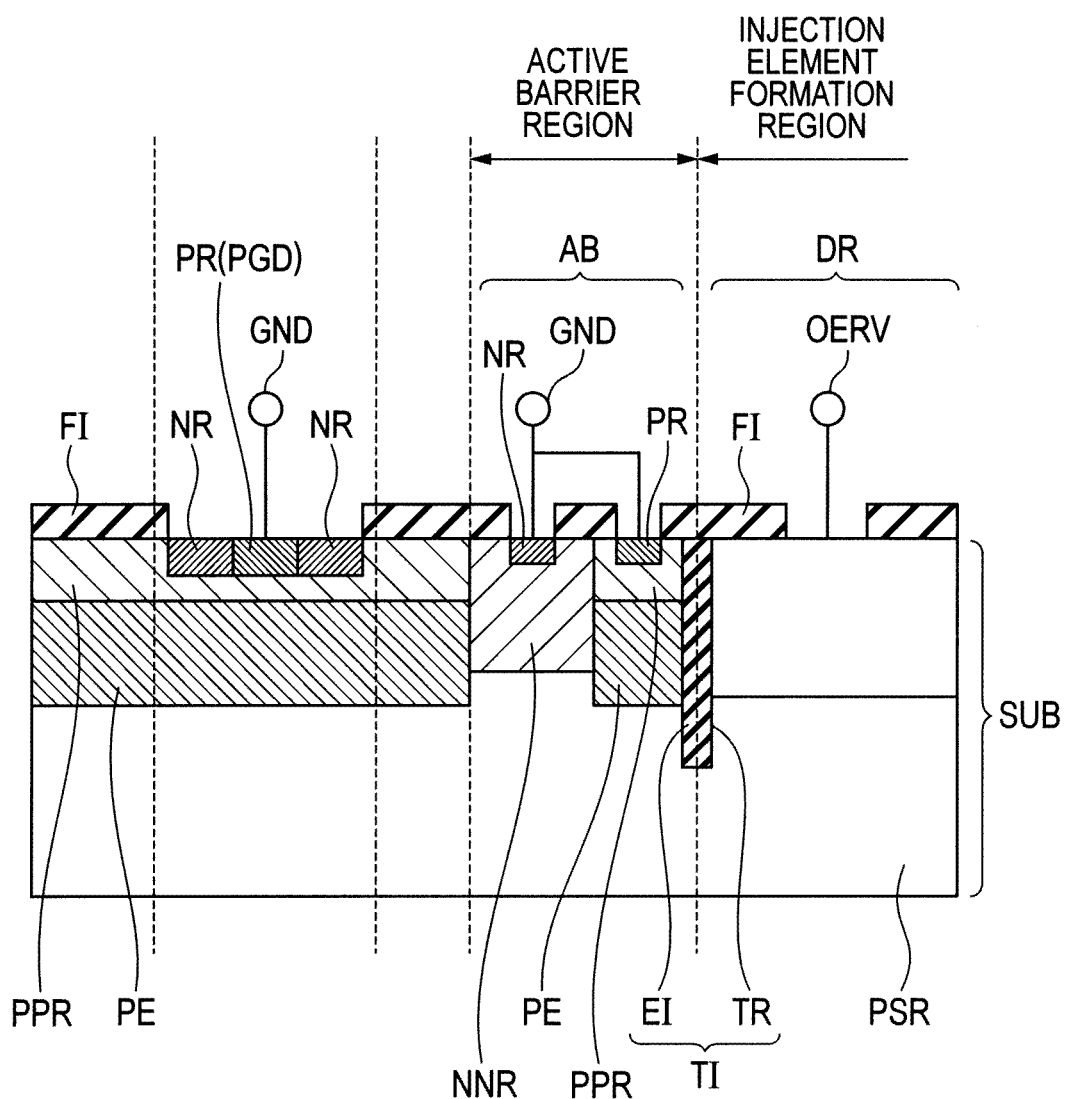
FIG. 12 is a schematic cross-sectional view taken along line XII-XII in FIG. 11.

Referring to FIG. 12, the n-type region NR of FIGS. 10 and 11 is so arranged as to be in contact with the p-type ground region PGD. Like the p-type region PR of the p-type grounding region PGD, the n-type region NR is so formed as to be electrically coupled with a laminated structure of the buried p-type diffusion region PE and the p⁻ diffusion region PPR over the p-type impurity region PSR.

Figure 13:
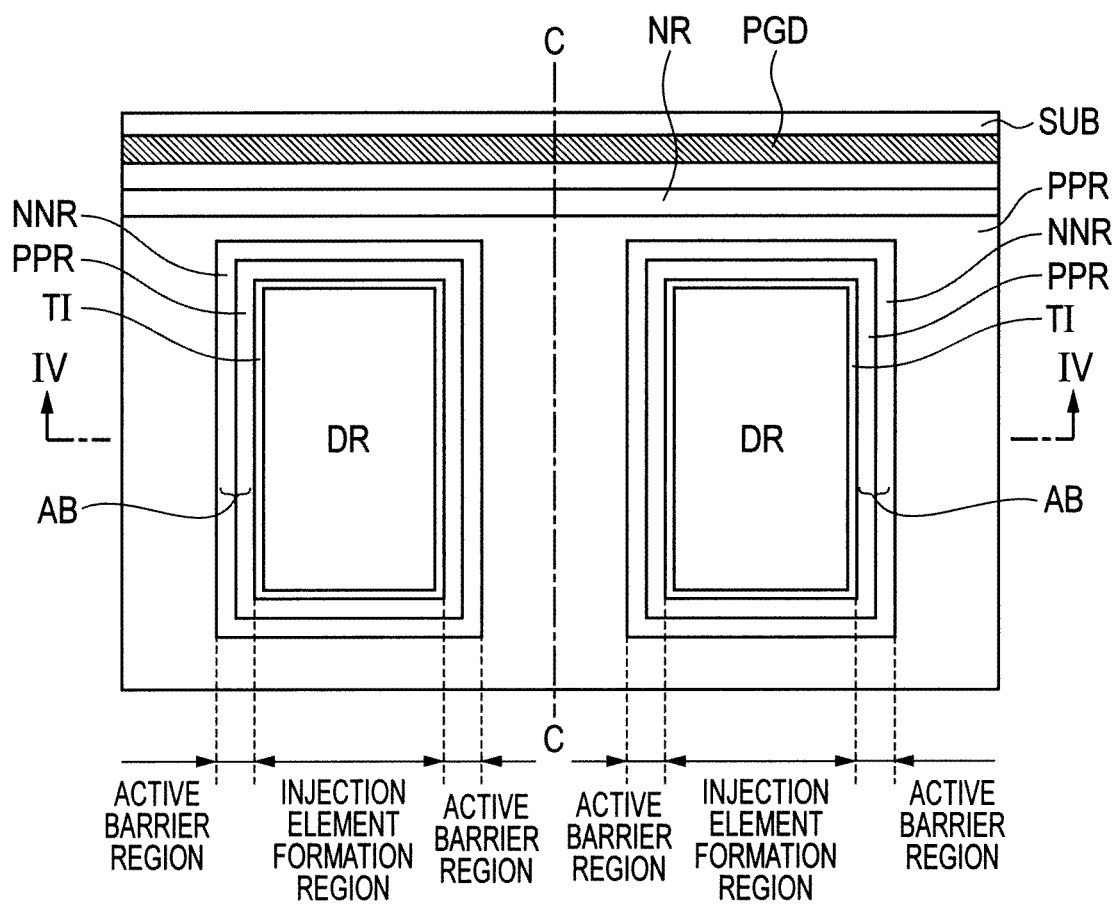
FIG. 13 is a schematic plan view showing a detailed configuration of a region of a modification being different from the one in FIG. 11 surrounded by the dotted line "XI" in FIG. 10.

However, referring to a modification of the present embodiment of FIG. 13, according to the present embodiment, it serves the purpose if the n-type region NR is arranged between the p-type ground region PGD and the injection element DR, and the n-type region NR may not be in contact with the p-type ground region PGD. Further, it may not surround the circumference of the p-type ground region PGD. It is preferable that, for example, the application voltage OERV or the ground potential GND is not applied to the n-type region NR and that the n-type region NR has a floating potential.

Rest of the configuration of the present embodiment is almost the same as the configuration in the first embodiment, and therefore the same components in FIGS. 10 to 13 as the first embodiment are denoted with the same reference characters and the description thereof will not be repeated.

Next, the operation and effect of the present embodiment will be described. In the present embodiment also, as in the first embodiment, for example, some of the electrons from the one injection element DR are attracted to the p-type ground region PGD. However, it becomes difficult for the electrons entering the n-type region NR arranged between one injection element DR and the p-type ground region PGD to leave the n-type region NR and move to the p-type region. This is because it is necessary for the electrons trying to enter the p-type region from the n-type region to get over the potential barrier at the border between the n-type region and the p-type region. That is, the n-type region serves as a resistor. Therefore, it becomes possible to reduce the probability that the electrons having entered the n-type region NR bypass (detour) as shown in FIG. 11, for example, enter the p⁻ diffusion region PPR, and further enter the other injection element DR. Therefore, the malfunction of the injection element is suppressed because the movement of the electrons from one injection element DR to the other injection element DR is suppressed by the n-type region NR arranged between the injection element DR and the p-type ground region PGD.

The second embodiment of the present invention differs from the first embodiment of the present invention in the above aspects alone. That is, with respect to the second embodiment of the present invention, the configuration, conditions, steps, effects, etc. which are not described all correspond to the ones in the first embodiment of the present invention.

Third Embodiment

The present embodiment differs from the first embodiment in the configuration for attracting electrons formed in the semiconductor device. Hereafter, the present embodiment will be described.

Figure 14:
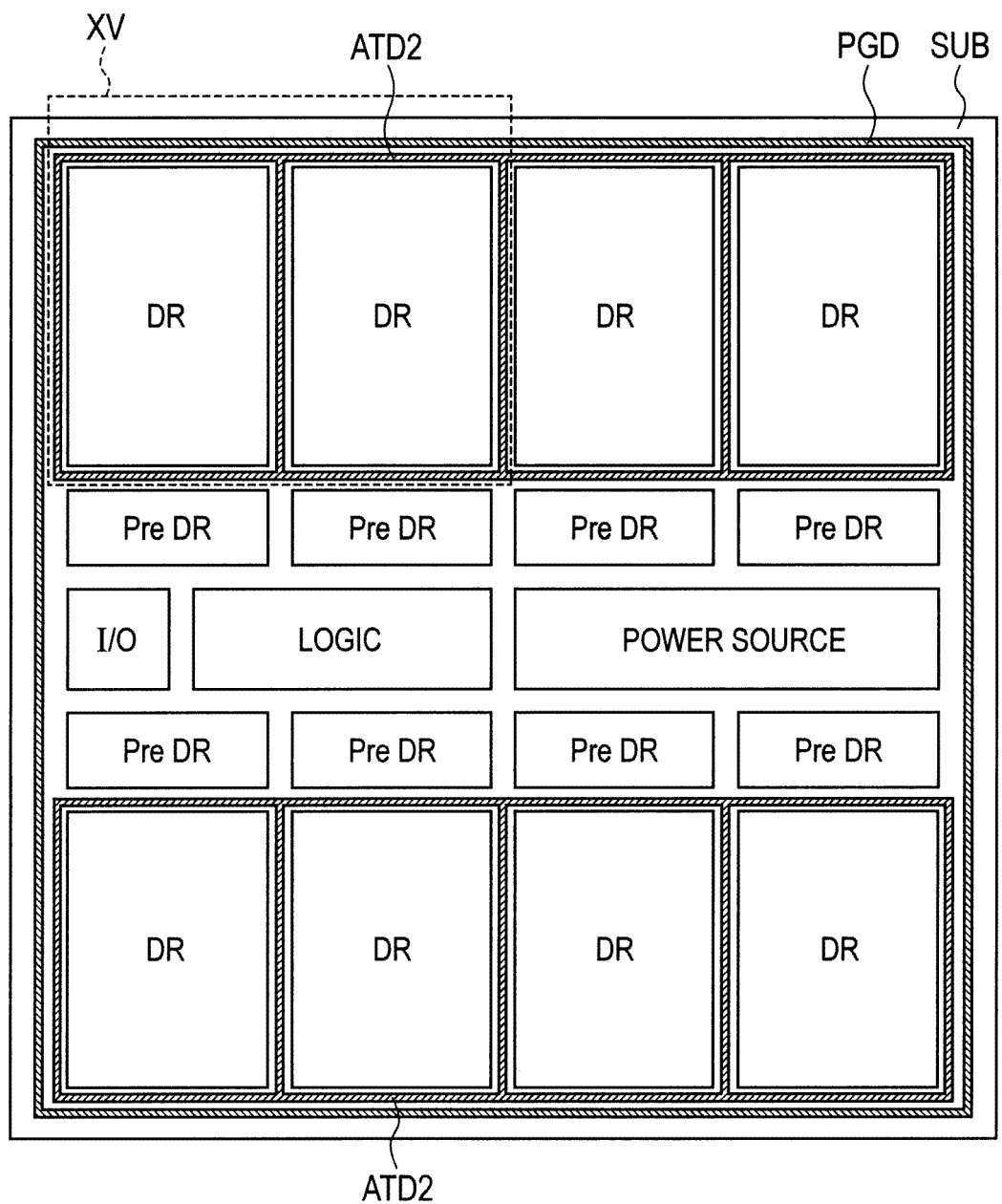
FIG. 14 is a schematic plan view showing a semiconductor device in a third embodiment of the present invention.
Figure 15:
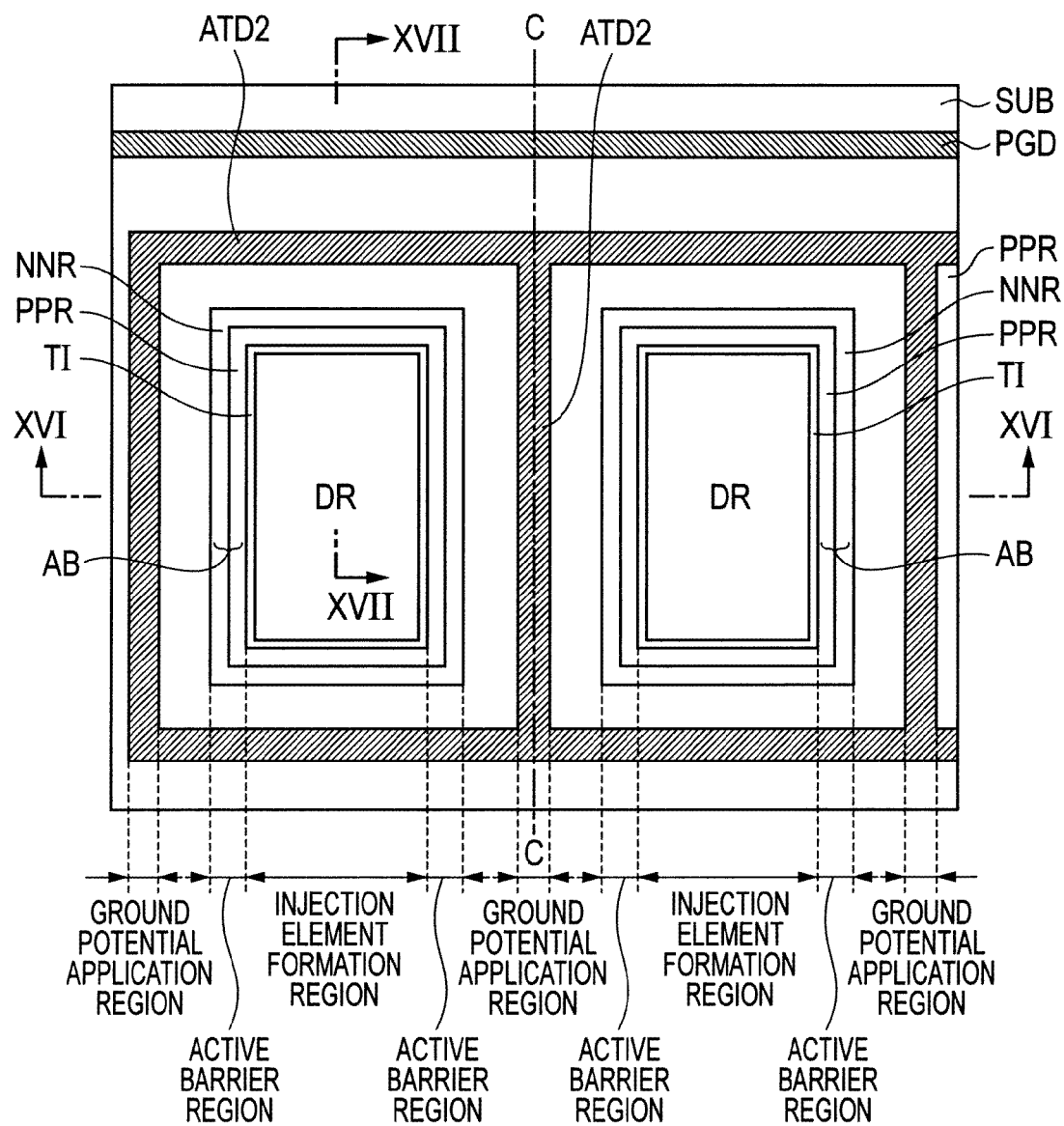
FIG. 15 is a schematic plan view showing a more detailed configuration of a region surrounded by a dotted line "XV" in FIG. 14.

Referring to FIGS. 14 and 15, according to the semiconductor device of the present embodiment, a tap part ATD2 (n-type ground region) is so arranged as to surround the circumference of two or more injection elements DR. In addition, the p-type ground region PGD of FIGS. 14 and 15 is not divided even by the region adjacent to the region sandwiched between the formation regions of the pair of adjacent injection elements DR over the main surface of the semiconductor substrate SUB, and extends along the direction in which two or more injection elements DR are arranged.

Figure 16:
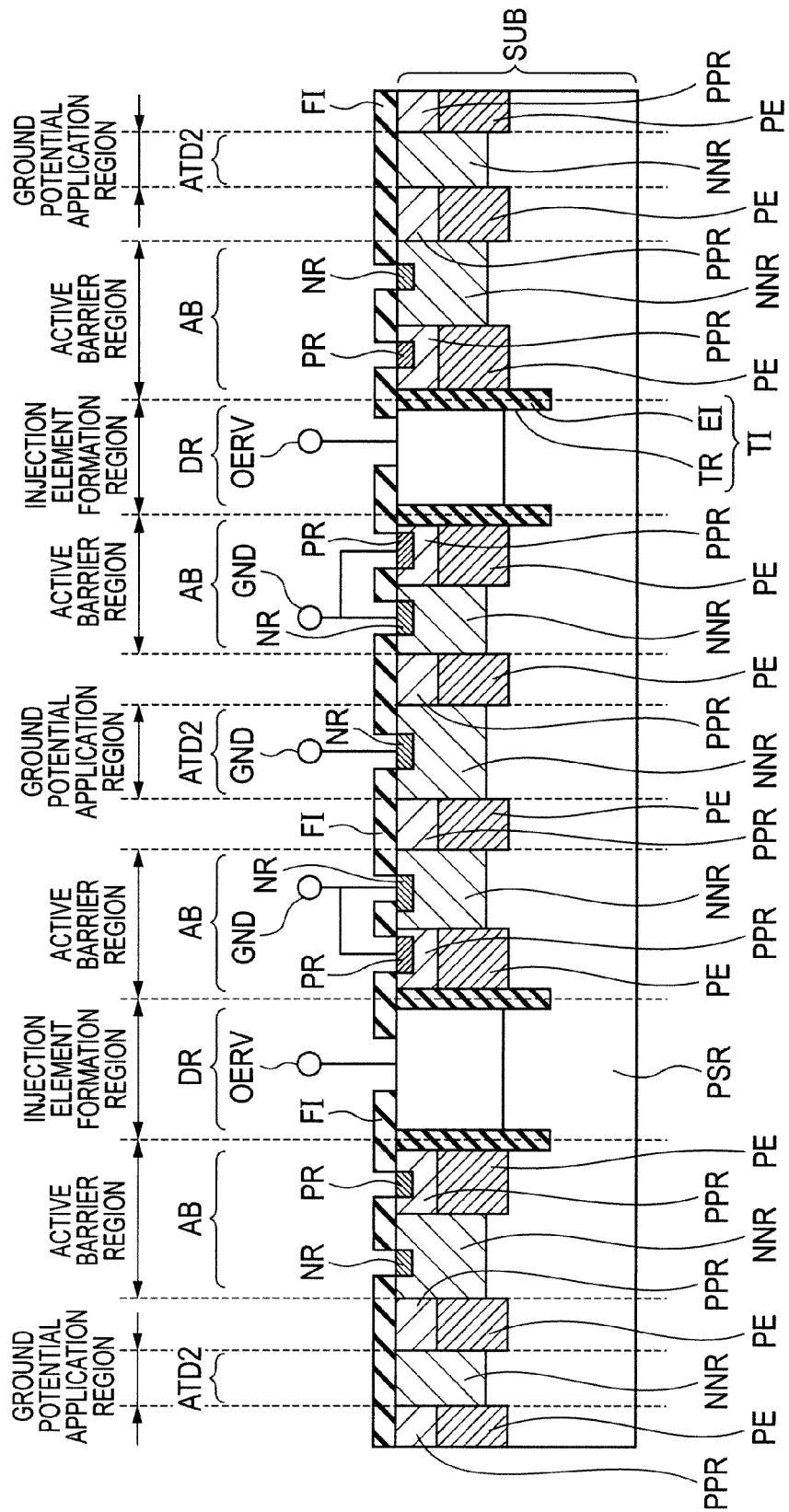
FIG. 16 is a schematic cross-sectional view taken along line XVI-XVI in FIG. 15.
Figure 17:
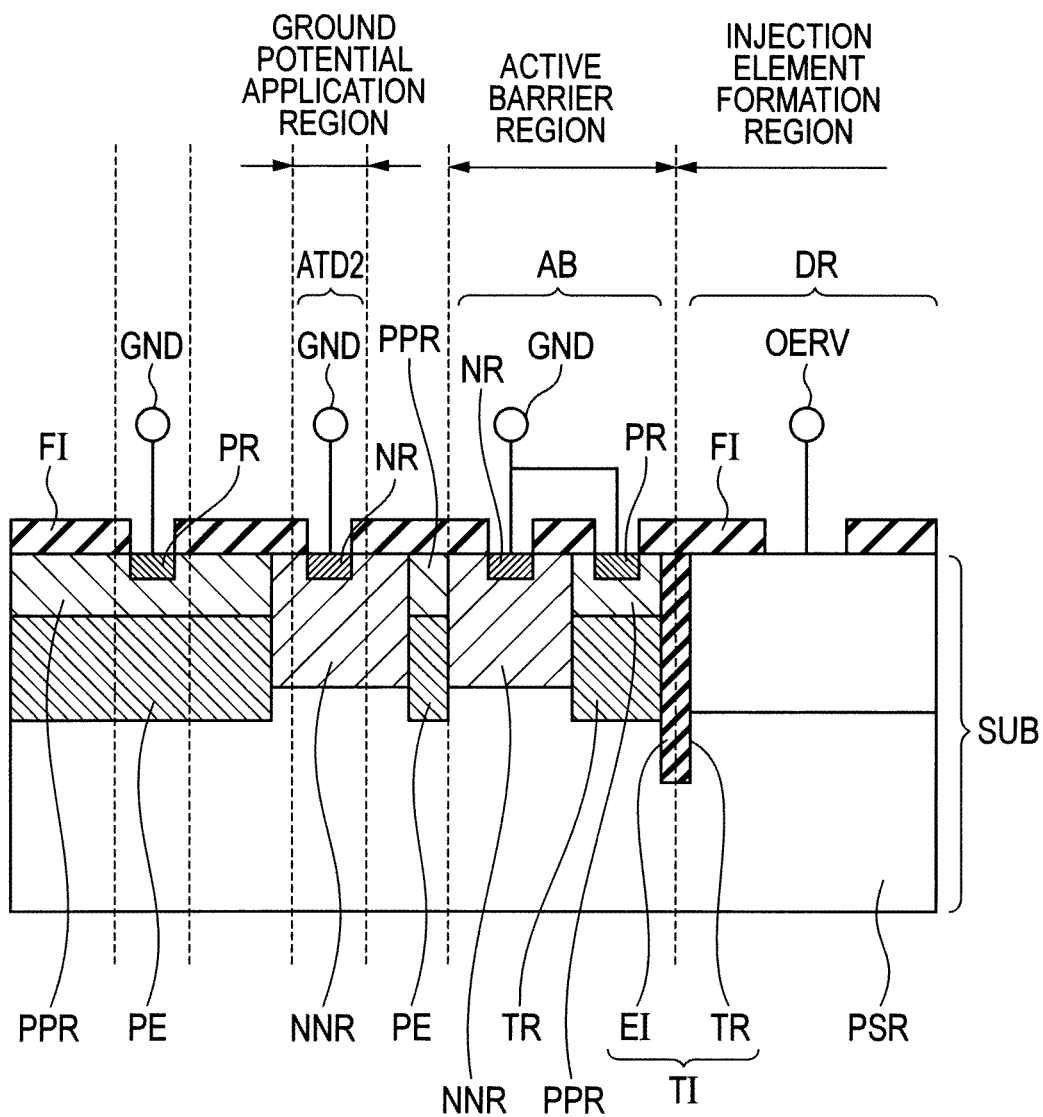
FIG. 17 is a schematic cross-sectional view taken along line XVII-XVII in FIG. 15.

Referring to FIGS. 16 and 17, the tap part ATD2 is an n-type region which is so formed over the p-type impurity region PSR from the main surface of the semiconductor substrate SUB as to be in contact with the p-type impurity region PSR inside the semiconductor substrate SUB. The tap part ATD2 has an n⁻ diffusion region NNR and an n-type diffusion region NR. According to the present embodiment also, a p⁻ diffusion region PPR is formed, through a buried p-type diffusion region PE, over the p-type impurity region PSR inside the semiconductor substrate SUB.

The ground terminal GND is coupled to the n-type diffusion region NR of the tap part ATD2. Accordingly, the ground potential GND can be applied to the p-type impurity region PSR of the semiconductor substrate SUB. That is, the tap part ATD2 functions as a ground potential application region.

Figure 18:
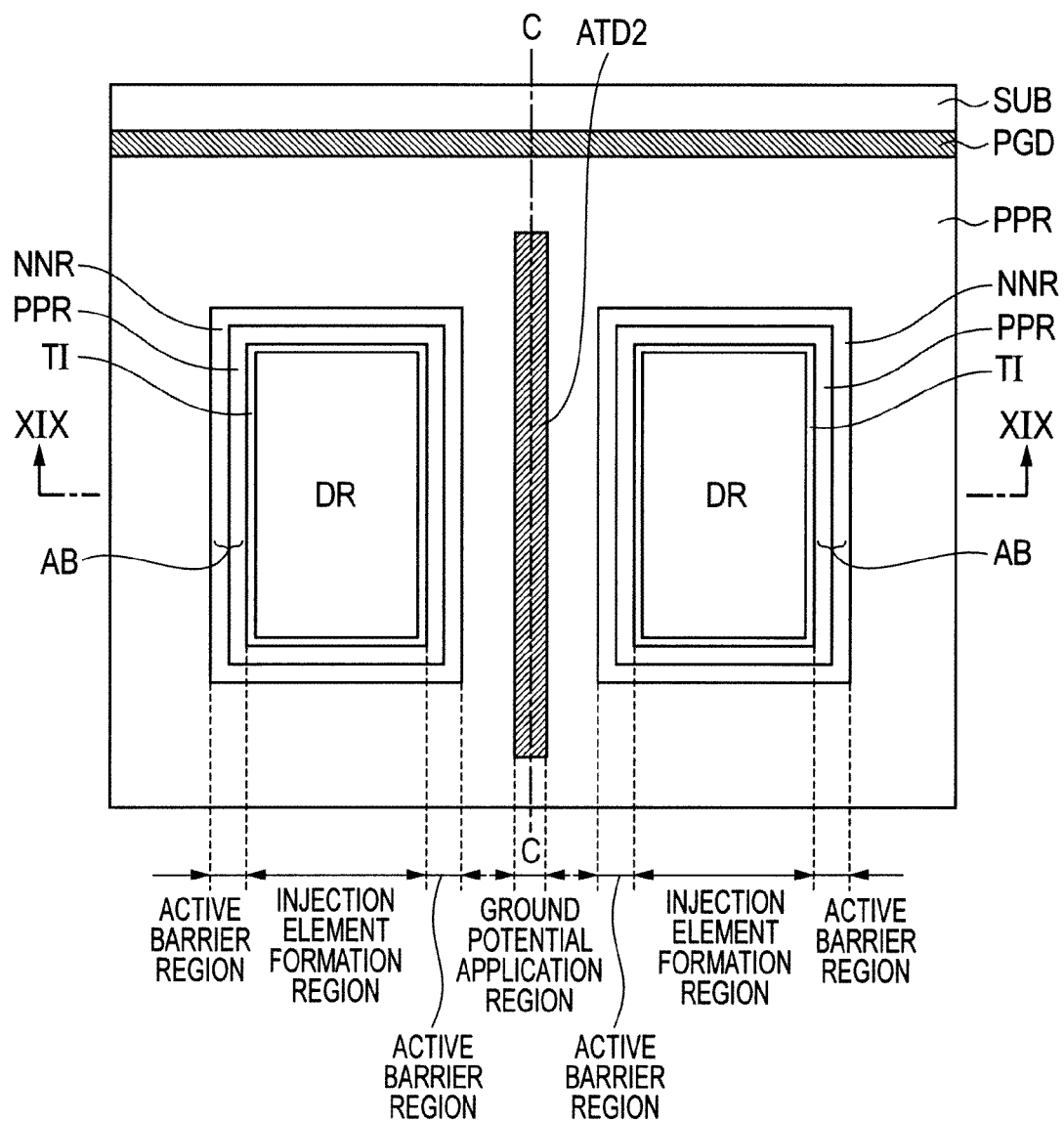
FIG. 18 is a schematic plan view showing a detailed configuration of a region of a modification being different from the one in FIG. 15 surrounded by the dotted line "XV" in FIG. 14.
Figure 19:
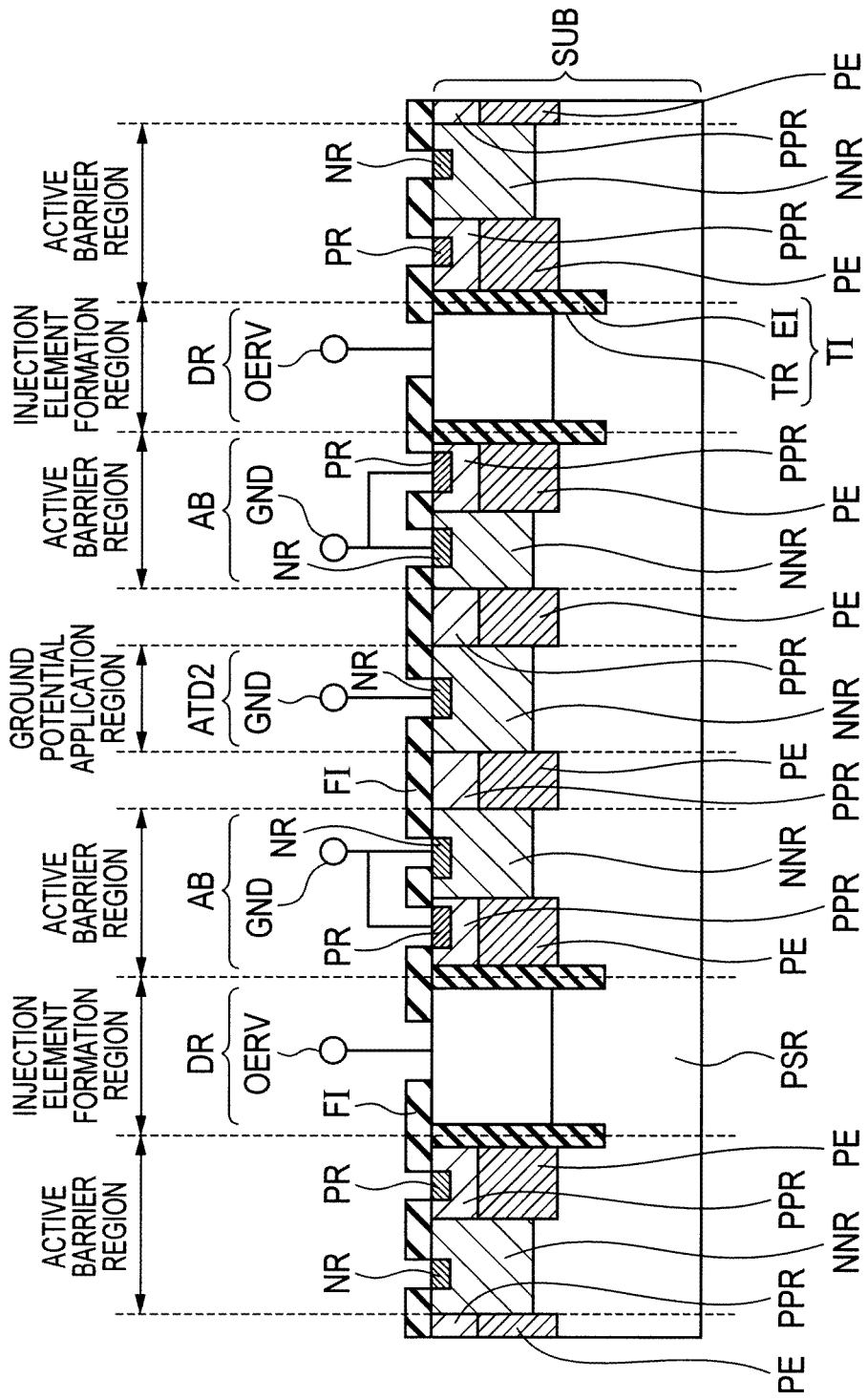
FIG. 19 is a schematic cross-sectional view taken along line XIX-XIX in FIG. 18.

However, referring to a modification of the present embodiment of FIGS. 18 and 19, according to the present embodiment, the tap part ATD2 may be arranged only in a region sandwiched between the pair of injection elements DR.

Rest of the configuration of the present embodiment is almost the same as the configuration of the first embodiment, and therefore the same components in FIGS. 14 to 19 as the first embodiment are denoted with the same reference characters and the description thereof will not be repeated.

Next, the operation and effect of the present embodiment will be described. In the present embodiment also, as in the first embodiment, for example, some of the electrons from one injection element DR are attracted to the p-type ground region PGD. However, some of the electrons go beyond the active barrier AB surrounding the circumference of one injection element DR and reach the tap part ATD2 between the pair of injection elements DR. The electrons having reached the tap part ATD2 are attracted by the ground voltage GND applied to the tap part ATD2 and are drawn out from the semiconductor substrate SUB. Thus, since the electrons are drawn out from the tap part ATD2, the electrons are prevented from reaching the other injection element DR.

Moreover, as shown in FIGS. 14 to 17, for example, when the tap part ATD2 surrounds the circumference of the injection element, the tap part ATD2 is arranged between the p-type ground region PGD and the injection element. Therefore, the tap part ATD2 between the p-type ground region PGD and the injection element comes to have the same function as the n-type region NR of the second embodiment. That is, the tap part ATD2 suppresses the attraction of the electrons toward the p-type ground region PGD and prevents the electrons from bypassing (detouring) from the p-type ground region PGD and moving toward the other injection element. For this reason, the tap part ATD2 surrounding the injection element DR can more reliably suppress the malfunction of the injection element.

Further, for example, in the comparative example shown in FIG. 6, the tap part ATD1 includes the p-type diffusion region PR. For this reason, the tap part ATD1 has a strong power to attract electrons. Therefore, since some of the electrons from one injection element formation region DR are attracted to the tap part ATD1, which are otherwise likely to pass by the undersurface of the semiconductor substrate SUB, the proportion of the electrons moving to the tap part ATD1 increases. Further, the proportion of some of the electrons moving toward the other injection element formation region DR with their momentum increases. However, in FIG. 19 of the present embodiment, for example, the tap part ATD2 between the pair of injection elements DR includes the n-type diffusion region NNR. For this reason, the tap part ATD2 itself does not have a function to attract electrons. Therefore, according to the present embodiment, it is possible to prevent the electrons from directly moving from one injection element to the other injection element.

The third embodiment of the present invention differs from the first embodiment of the present invention in the above aspects alone. That is, with respect to the third embodiment of the present invention, the configuration, conditions, steps, effects, etc., which are not described above, all correspond to the ones in the first embodiment of the present invention.

(Modification)

By combining the above embodiments of the present invention and, for example, preparing embodiments shown in FIGS. 20 to 23 below, it is possible to suppress the movement of the electrons from the above one injection element to the other injection element and to suppress the malfunction of the injection element.

Figure 20:
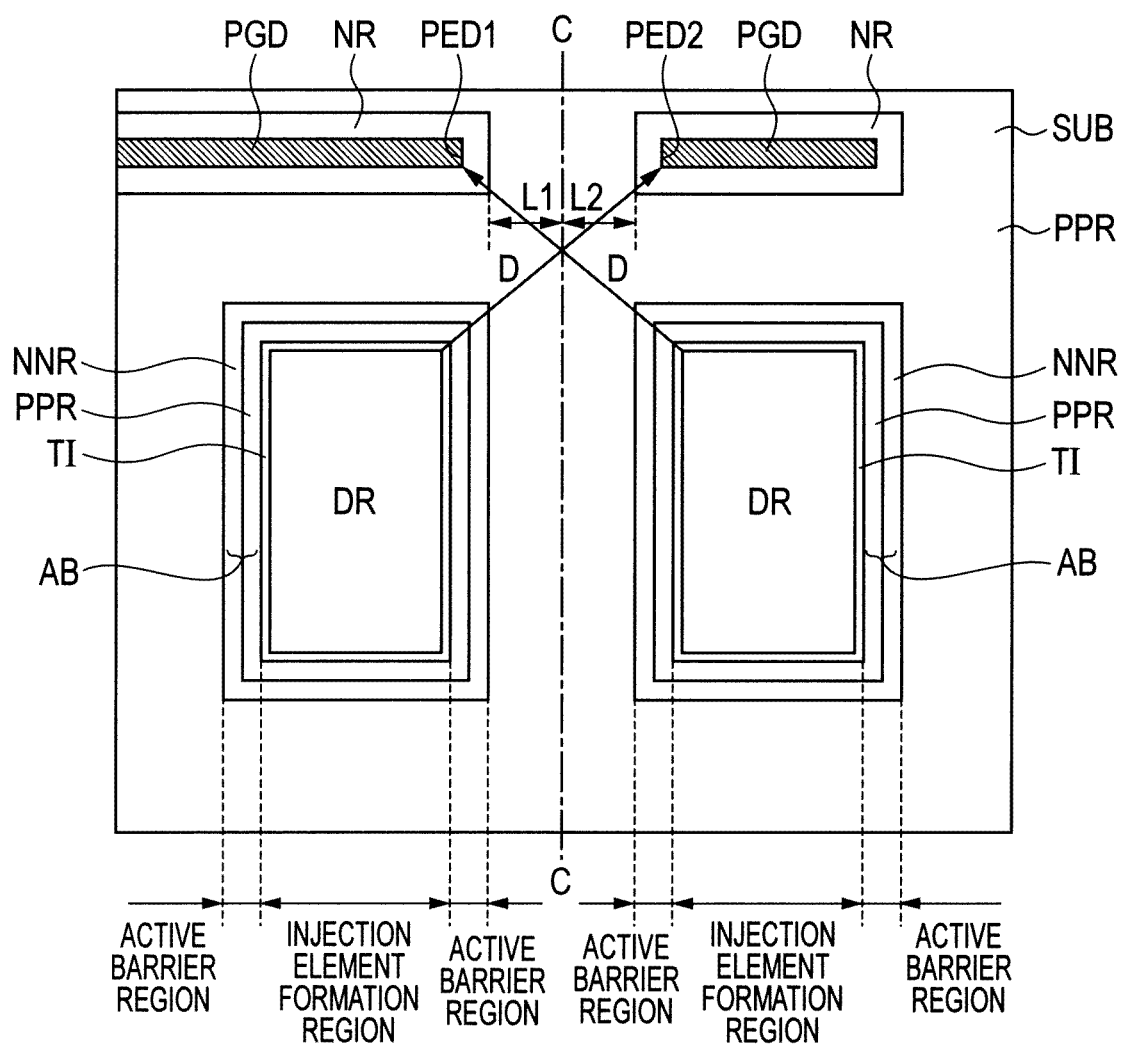
FIG. 20 is a schematic plan view showing a detailed configuration of a first modification in which the embodiments of the present invention are combined.

Referring to FIG. 20, for example, as in the first embodiment, the n-type region NR may be so arranged as to surround the circumference of the divided p-type ground region PGD. The n-type region NR has the configuration and effects similar to those of the n-type region NR in FIG. 11 of the second embodiment. Though not shown, as in FIG. 13 for example, the n-type region NR may be arranged between the p-type ground region PGD and the injection element DR, and the p-type ground region PGD may not be in contact with the n-type region NR.

Figure 21:
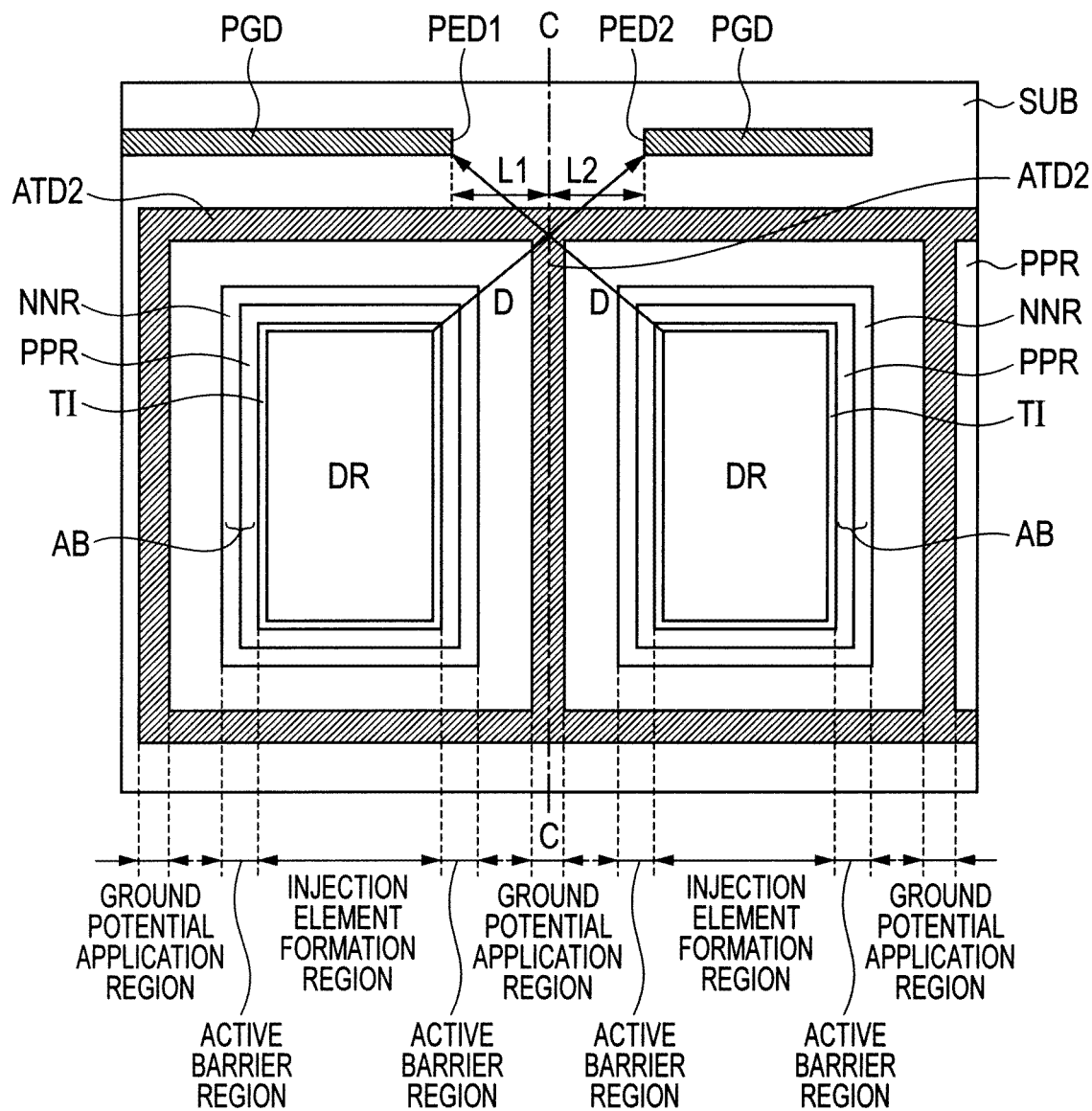
FIG. 21 is a schematic plan view showing a detailed configuration of a second modification in which the embodiments of the present invention are combined.

Referring to FIG. 21, the configuration may be the one combining the divided p-type ground region PGD as in the first embodiment and the tap part ATD2 surrounding the injection element DR as in the third embodiment.

Figure 22:
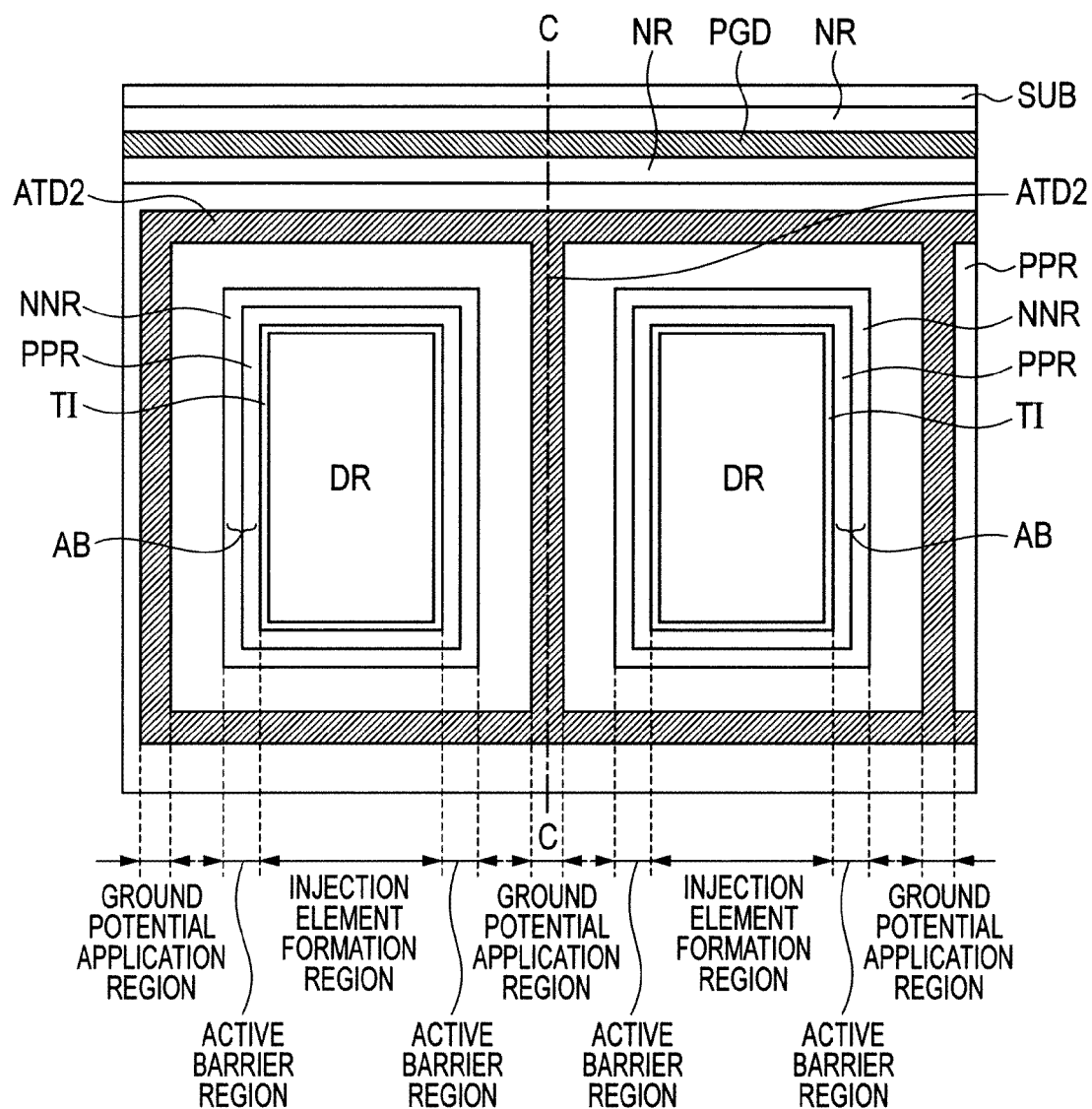
FIG. 22 is a schematic plan view showing a detailed configuration of a third modification in which the embodiments of the present invention are combined.

Referring to FIG. 22, the configuration may be the one combining the n-type region NR surrounding the circumference of the p-type ground region PGD as in the second embodiment and the tap part ATD2 surrounding the circumference of the injection element DR as in the third embodiment.

Figure 23:
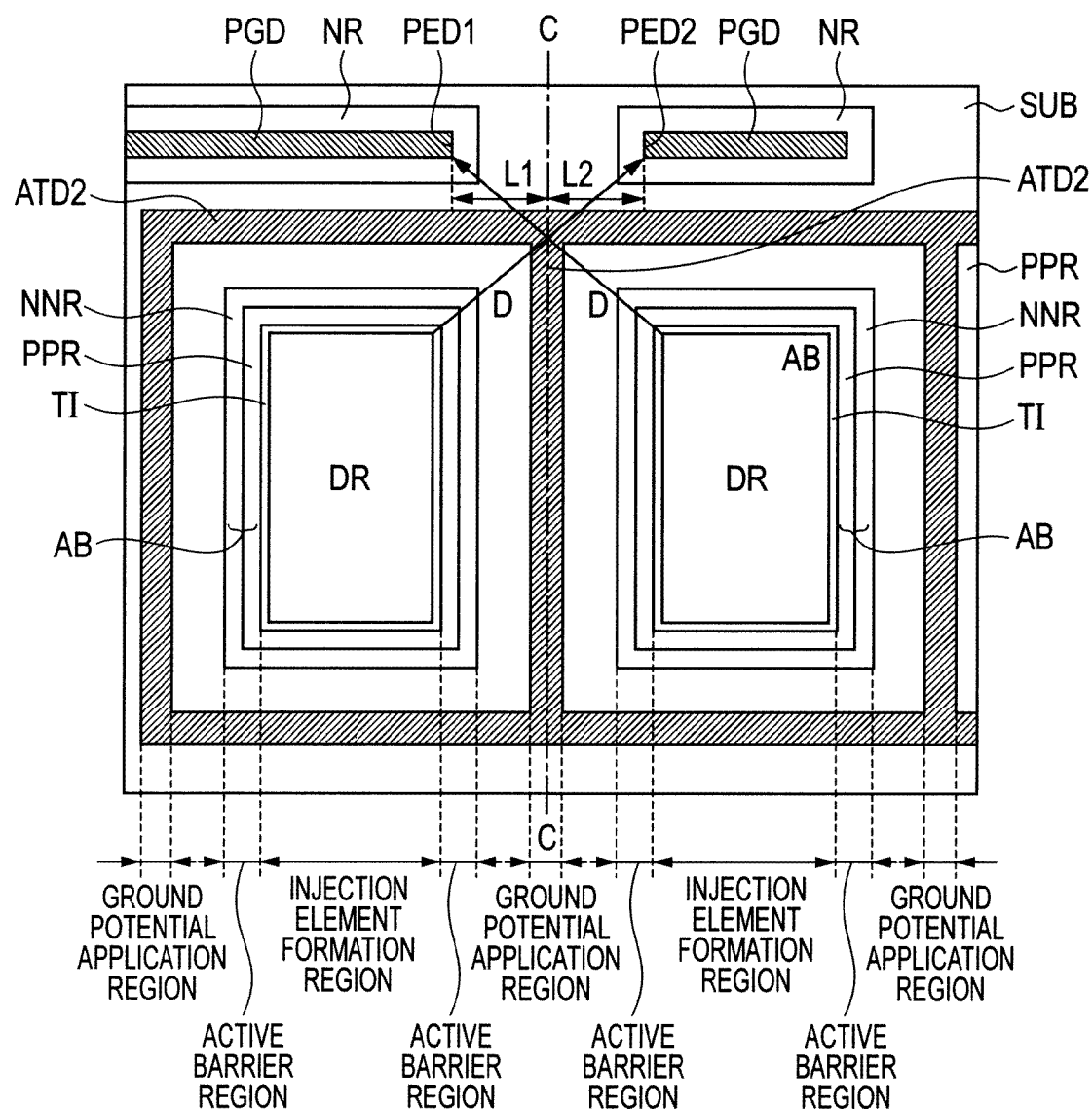
FIG. 23 is a schematic plan view showing a detailed configuration of a fourth modification in which the embodiments of the present invention are combined.

Referring to FIG. 23, the configuration may be the one combining the divided p-type ground region PGD as in the first embodiment, the n-type region NR surrounding the circumference of the p-type ground region PGD as in the second embodiment, and the tap part ATD2 surrounding the circumference of the injection element DR as in the third embodiment.

In either one of the embodiments of the present invention, in each of the pair of active barrier regions AB, the p-type barrier region is arranged closer (on the inner side) to the injection element DR surrounded by the active barrier region AB than the n-type barrier region. When the electrons are taken into the n-type barrier region as above, the potential of the p-type barrier region which is ohmic-connected to the n-type barrier region is lowered and the electrons are less likely to advance to the p-type barrier region side. As a result, the electrons are more reliably prevented from moving to the p-type barrier region and further to the injection element inside.

The embodiments disclosed herein should be considered as illustrative from all points of view and not limitative. The present invention is not defined by the above description but, rather, is defined by the claims and is intended to include the meanings equivalent to the claims as well as all of the modifications within the scope.

The present invention may advantageously be adopted specifically to a semiconductor device having injection elements containing inductive loads and a logic circuit.

What is claimed is:

1. A semiconductor device, comprising:
   a semiconductor substrate having a main surface and a first p-type region formed therein;
   a pair of injection elements formed in said first p-type region and over said main surface;
   an active barrier structure arranged in a region sandwiched between said pair of injection elements over said main surface, the active barrier structure being formed such that a second p-type region and an n-type region having a floating potential are ohmic-connected through a conductive layer; and a ground potential-applicable p-type ground region which is formed closer to an end side of said main surface than said pair of injection elements and said active barrier structure, bypassing said region sandwiched between said pair of injection elements over said main surface, and which is electrically coupled to said p-type region, wherein said p-type ground region is divided by a region adjacent to said region sandwiched between said pair of injection elements.

2. A semiconductor device according to claim 1, wherein said p-type ground region is so arranged as to be in line symmetry with respect to a center line between said pair of injection elements over said main surface.

3. A semiconductor device according to claim 1 or 2, wherein said p-type ground region comes to have one end part on the side of one injection element of said pair of injection elements and the other end part on the side of the other injection element of said pair of injection elements when divided; and wherein a shortest distance between said one injection element and said other end part of said p-type ground region over said main surface and a shortest distance between said the other injection element and said one end part of said p-type ground region over said main surface are greater than a thickness of said semiconductor substrate.

4. A semiconductor device according to claim 1, further comprising an n-type region arranged between each of said pair of injection elements and said p-type ground region over said main surface.

5. A semiconductor device according to claim 4, wherein said n-type region is so arranged as to surround the circumference of said p-type ground region over said main surface.

6. A semiconductor device according to claim 4 or 5, wherein said n-type region has a floating potential.

7. A semiconductor device according to claim 1, further comprising a ground potential-applicable n-type ground region arranged in said region sandwiched between said pair of injection elements over said main surface.

8. A semiconductor device according to claim 7, wherein said n-type ground region is so arranged as to surround the circumference of each of said pair of injection elements over said main surface.

9. A semiconductor device, comprising a semiconductor substrate having a main surface and a p-type region formed therein;

a pair of injection elements formed in said p-type region and over said main surface;

an active barrier structure arranged in a region sandwiched between said pair of injection elements over said main surface;

a ground potential-applicable p-type ground region which is formed closer to an end side of said main surface than said pair of injection elements and said active barrier structure, bypassing said region sandwiched between said pair of injection elements over said main surface, and which is electrically coupled to said p-type region; and an n-type region arranged between each of said pair of injection elements and said p-type ground region over said main surface.

10. A semiconductor device according to claim 9, wherein said n-type region is so arranged as to surround the circumference of said p-type ground region over said main surface.

11. A semiconductor device according to claim 9 or 10, wherein said n-type region has a floating potential.

12. A semiconductor device according to claim 9, further comprising a ground potential-applicable n-type ground region arranged in said region sandwiched between said pair of injection elements over said main surface.

13. A semiconductor device according to claim 12, wherein said n-type ground region is so arranged as to surround the circumference of each of said pair of injection elements over said main surface.

14. A semiconductor device, comprising:

a semiconductor substrate having a main surface and a p-type region formed therein;

a pair of injection elements formed in said p-type region and over said main surface;

an active barrier structure arranged in a region sandwiched between said pair of injection elements over said main surface;

a ground potential-applicable n-type ground region arranged in said region sandwiched between said pair of injection elements over said main surface; and a ground potential-applicable p-type ground region which is formed closer to an end part side of said main surface than said pair of injection elements, said active barrier structure and said n-type ground region, bypassing said region sandwiched between said pair of injection elements over said main surface, and which is electrically coupled to said p-type region.

15. A semiconductor device according to claim 14, wherein said n-type ground region is so arranged as to surround the circumference of each of said pair of injection elements over said main surface.

16. A semiconductor device according to claim 1, 9 or 14, wherein said active barrier structure surrounds each of said pair of injection elements over said main surface and includes a p-type barrier region and an n-type barrier region which are ohmic-connected to each other, and wherein said p-type barrier region is arranged on the inner circumferential side than said n-type barrier region.

* * * * *